US012690493B2

(12) United States Patent
Yen et al.

(10) Patent No.: US 12,690,493 B2
(45) Date of Patent: Jul. 21, 2026

(54) LED CHIP PACKAGING MODULE, FABRICATION METHOD THEREOF, AND DISPLAY

(71) Applicant: HUAWEI TECHNOLOGIES CO., LTD., Shenzhen (CN)

(72) Inventors: Hsi Hsuan Yen, Chiba (JP); Zhao Xiang, Dongguan (CN); Haibiao Wei, Dongguan (CN); Jianhua Ding, Dongguan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 610 days.

(21) Appl. No.: 18/158,514

(22) Filed: Jan. 24, 2023

(65) Prior Publication Data

US 2023/0163111 A1      May 25, 2023

Related U.S. Application Data

(63) Continuation of application No. PCT/CN2021/096807, filed on May 28, 2021.

(30) Foreign Application Priority Data

Jul. 28, 2020    (CN) .......................... 202010736548.8

(51) Int. Cl.
*H01L 29/205*        (2006.01)
*H01L 33/00*         (2010.01)
(Continued)

(52) U.S. Cl.
CPC .......... *H10W 90/00* (2026.01); *H10H 20/857* (2025.01); *H10H 20/018* (2025.01); (Continued)

(58) Field of Classification Search
CPC .......... G09G 200/0443–0447; G09G 2330/10; G09G 2300/0804; G09G 2300/0876
See application file for complete search history.

(56) References Cited

U.S. PATENT DOCUMENTS

2009/0321759 A1    12/2009  Xu
2012/0256814 A1*   10/2012  Ootorii ................ G09G 3/3208
                                                              345/82
(Continued)

FOREIGN PATENT DOCUMENTS

CN        105793795 A       7/2016
CN        109314105 A       2/2019
(Continued)

OTHER PUBLICATIONS

Extended European Search Report issued in European Application No. 21851582.3 dated Dec. 8, 2023.
(Continued)

*Primary Examiner* — Ismail A Muse

(57) ABSTRACT

An LED chip packaging module includes a re-distribution layer (RDL). A plurality of first pads are disposed on a lower surface of the RDL. A micro light emitting diode (LED) chip disposed on an upper surface of the RDL. An electrode of the micro LED chip faces the upper surface of the RDL and is connected to the RDL. A micro integrated circuit (IC) is disposed on the upper surface of the RDL. An electrode of the micro IC faces the upper surface of the RDL and is connected to the RDL. The first pads are electrically connected to the micro IC by using the RDL. The micro IC is electrically connected to the micro LED chip by using the RDL. The first pad is configured to receive an external drive signal.

13 Claims, 19 Drawing Sheets

(51) Int. Cl.

| | |
|---|---|
| *H10H 20/857* | (2025.01) |
| *H10W 90/00* | (2026.01) |
| *H10H 20/01* | (2025.01) |
| *H10W 70/09* | (2026.01) |
| *H10W 70/60* | (2026.01) |
| *H10W 70/652* | (2026.01) |
| *H10W 72/00* | (2026.01) |
| *H10W 72/20* | (2026.01) |

(52) U.S. Cl.

CPC ............ *H10W 70/09* (2026.01); *H10W 70/60* (2026.01); *H10W 70/6528* (2026.01); *H10W 72/07236* (2026.01); *H10W 72/242* (2026.01); *H10W 90/722* (2026.01)

(56) References Cited

U.S. PATENT DOCUMENTS

| | | | |
|---|---|---|---|
| 2015/0169011 A1* | 6/2015 | Bibl | H01L 23/5386 |
| | | | 345/175 |
| 2016/0308089 A1 | 10/2016 | Kim et al. | |
| 2017/0179360 A1* | 6/2017 | Miyoshi | H01L 25/0753 |
| 2018/0033374 A1* | 2/2018 | Jeong | G09G 3/2088 |
| 2018/0045383 A1* | 2/2018 | Hasegawa | H01L 25/04 |
| 2018/0047876 A1* | 2/2018 | Chu | H01L 25/0753 |
| 2018/0277528 A1* | 9/2018 | Hasegawa | H01L 23/5383 |
| 2019/0096864 A1* | 3/2019 | Huitema | H01L 21/561 |
| 2020/0135092 A1* | 4/2020 | Ahmed | H10D 86/40 |
| 2020/0303605 A1* | 9/2020 | Jang | H01L 25/0756 |
| 2021/0183833 A1* | 6/2021 | Hu | H01L 25/167 |
| 2021/0375833 A1* | 12/2021 | Lee | H10H 20/857 |

FOREIGN PATENT DOCUMENTS

| | | |
|---|---|---|
| CN | 111028697 A | 4/2020 |
| CN | 210403726 U | 4/2020 |
| CN | 111933630 A | 11/2020 |
| JP | 2017152681 A | 8/2017 |
| KR | 20190035319 A | 4/2019 |

OTHER PUBLICATIONS

International Search Report and Written Opinion issued in PCT Application No. PCT/CN2021/096807 dated Aug. 26, 2021.

Chinese Office Action issued in Chinese Application No. 202010736548.8 dated Nov. 15, 2024.

* cited by examiner

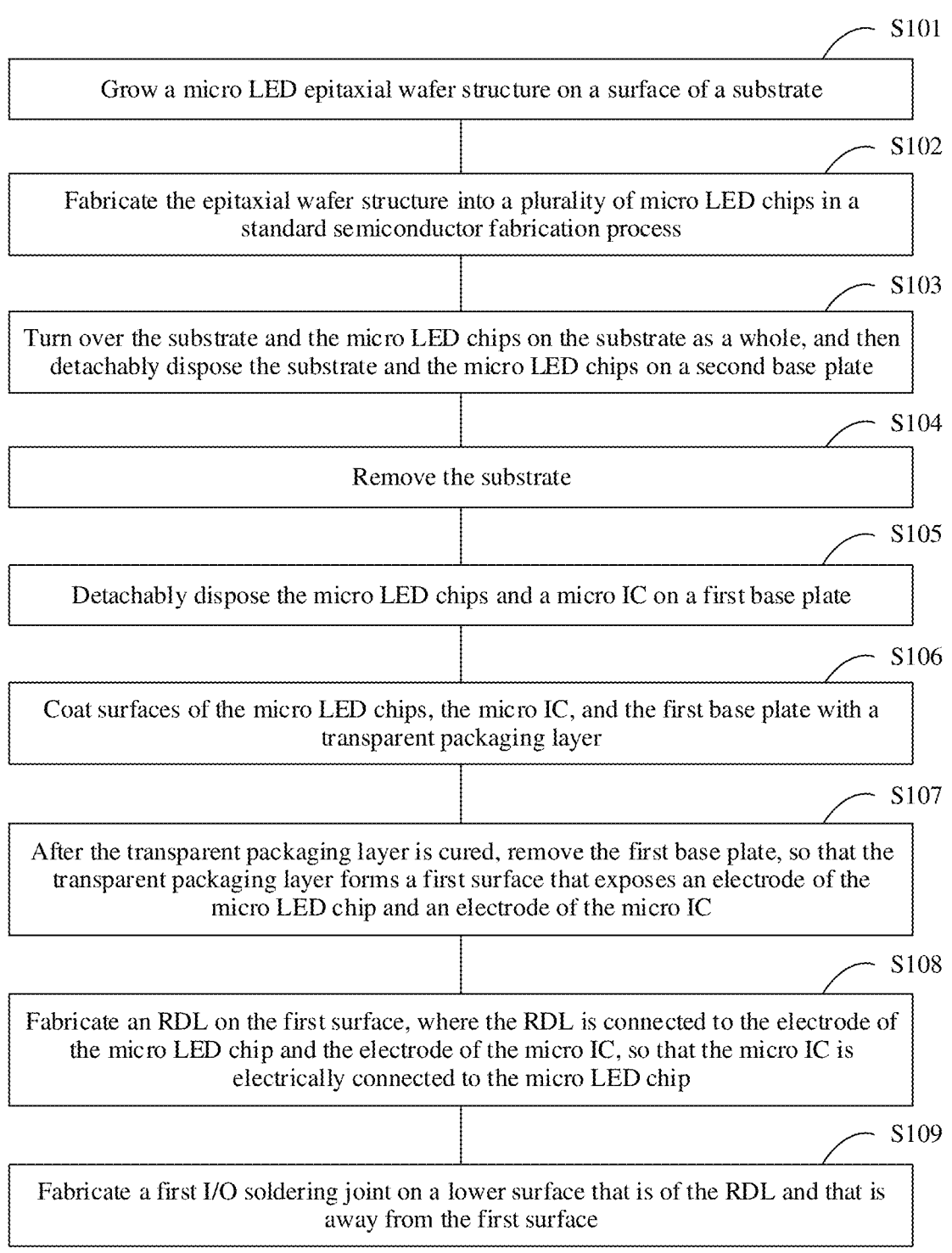

S101

Grow a micro LED epitaxial wafer structure on a surface of a substrate

S102

Fabricate the epitaxial wafer structure into a plurality of micro LED chips in a standard semiconductor fabrication process

S103

Turn over the substrate and the micro LED chips on the substrate as a whole, and then detachably dispose the substrate and the micro LED chips on a second base plate

S104

Remove the substrate

S105

Detachably dispose the micro LED chips and a micro IC on a first base plate

S106

Coat surfaces of the micro LED chips, the micro IC, and the first base plate with a transparent packaging layer

S107

After the transparent packaging layer is cured, remove the first base plate, so that the transparent packaging layer forms a first surface that exposes an electrode of the micro LED chip and an electrode of the micro IC

S108

Fabricate an RDL on the first surface, where the RDL is connected to the electrode of the micro LED chip and the electrode of the micro IC, so that the micro IC is electrically connected to the micro LED chip

S109

Fabricate a first I/O soldering joint on a lower surface that is of the RDL and that is away from the first surface

FIG. 3

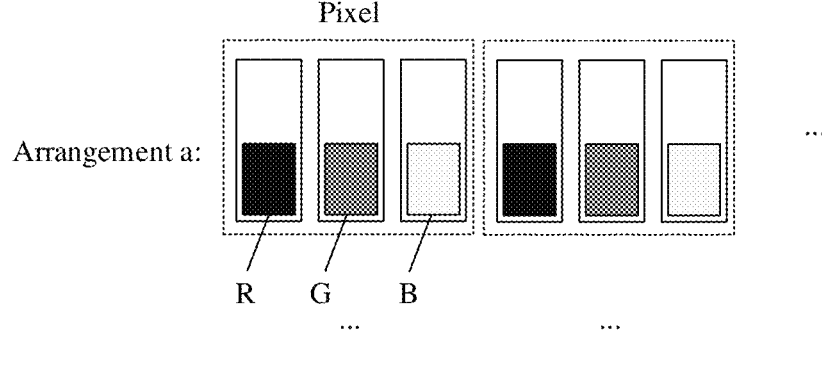
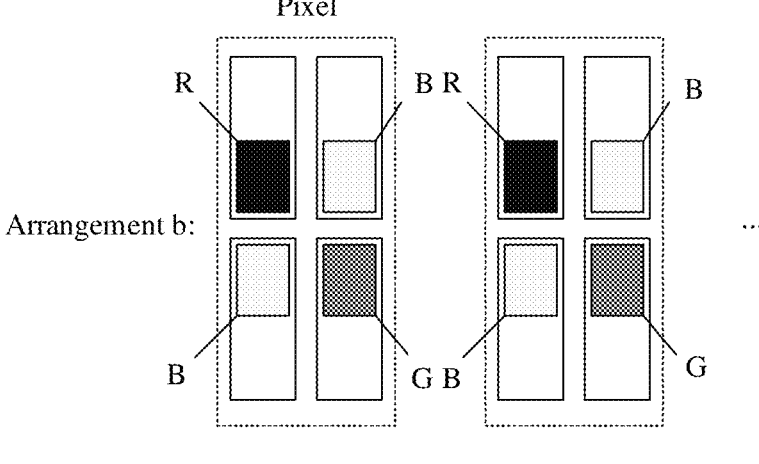
FIG. 22
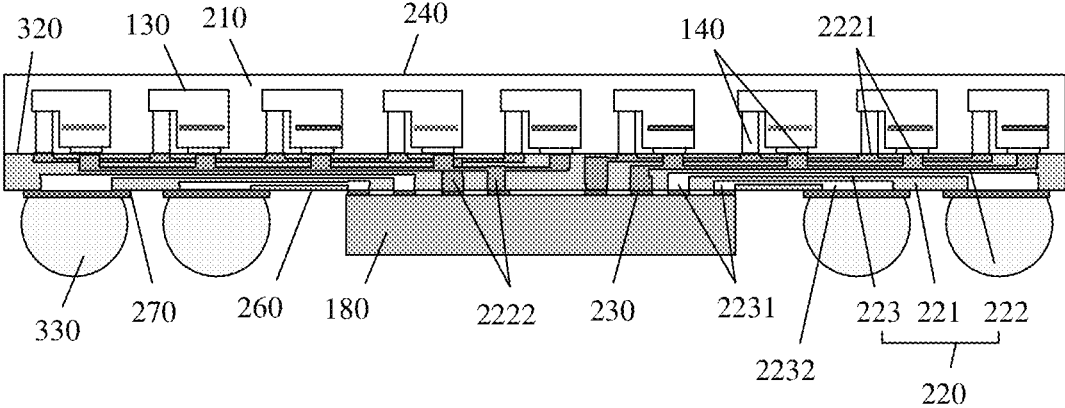
FIG. 23

LED CHIP PACKAGING MODULE, FABRICATION METHOD THEREOF, AND DISPLAY

CROSS-REFERENCE TO RELATED APPLICATIONS

This application is a continuation of International Application No. PCT/CN2021/096807, filed on May 28, 2021, which claims priority to Chinese Patent Application No. 202010736548.8, filed on Jul. 28, 2020. The disclosures of the aforementioned applications are hereby incorporated by reference in their entireties.

TECHNICAL FIELD

This disclosure relates to the field of semiconductor technologies, and in particular, to an LED chip packaging module, a fabrication method thereof, and a display.

BACKGROUND

A micro LED is also referred to as a micro light emitting diode, and is a self-light-emitting lighting device possibly applied to a next-generation display technology after a liquid crystal display (LCD) and an active-matrix organic light-emitting diode (AMOLED).

A core technology of a micro LED display is to combine millions to tens of millions of LED chips with sizes of tens of microns to form pixels of the display. Since an LED chip is a semiconductor device, structures such as metal electrodes on a surface of the LED chip may be processed in a semiconductor fabrication process. If the LED chip is to be sequentially arranged, according to design, on a drive back-plane of a thin film transistor (TFT), a passive matrix (PM) line, or the like, mass transfer, micro bonding, and other processes are required. Different from conventional LED packaging processes in which only one single LED chip is transferred each time, in a mass transfer technology, a polydimethylsiloxane (PDMS) base material or another transfer head or stamp simultaneously transfers tens of thousands to hundreds of thousands of LED chips, to meet an output requirement for transferring more than a million LED chips in a short time period.

A size of a micro LED chip is only tens of microns. In a future objective for mass production, the size of the micro LED chip is expected to be reduced to 5 to 10 microns. Therefore, a size of a micro bump fabricated on the micro LED chip and a bonding process also needs to be reduced to less than 10 microns. In a conventional micro LED chip fabrication technology, bonding a micro LED chip and a drive backplane of a display is very difficult, and this adversely affects improvement of a production yield of display products.

SUMMARY

Embodiments of this disclosure provide an LED chip packaging module, a fabrication method thereof, and a display, to reduce bonding difficulty between a micro LED chip and a drive backplane of a display, and improve the yield of display products.

To achieve the foregoing objective, embodiments of this disclosure provide the following technical solutions.

According to a first aspect, an embodiment of this disclosure provides an LED chip packaging module, including:

a re-distribution layer RDL, where a plurality of first pads are disposed on a lower surface of the RDL; a micro light emitting diode micro LED chip disposed on an upper surface of the RDL, where an electrode of the micro LED chip faces the RDL and is connected to the RDL; and a micro integrated circuit micro IC disposed on the upper surface and/or the lower surface of the RDL, where an electrode of the micro IC faces the RDL and is connected to the RDL. The first pad is electrically connected to the micro IC by using the RDL. The micro IC is electrically connected to the micro LED chip by using the RDL. The first pad is configured to receive an external drive signal. The micro IC is configured to control, based on the external drive signal, a working state of the micro LED chip electrically connected to the micro IC. When the micro LED chip packaging module provided in this embodiment of this disclosure is driven by an external drive signal, the drive signal first controls the micro IC, and then the micro IC controls, based on the drive signal, a working state of at least one micro LED chip connected to the micro IC. In this way, a pad configured for connecting the electrode of the micro LED chip to external devices such as a drive backplane does not need to be disposed on the LED chip packaging module. This can reduce a quantity of pads between the micro LED chip packaging module and the external devices such as the drive backplane. Therefore, for the LED chip packaging module and the drive backplane that have a same size, a size of each pad may be larger, to greatly reduce bonding difficulty between the LED chip packaging module and the drive backplane, and improve product yield.

In an implementation, the micro LED chip forms a plurality of pixels, and each of the pixels includes at least one micro LED chip. Therefore, one or more micro LED chips may flexibly form pixels with different color capabilities, for example, full-color pixels and monochromatic pixels.

In an implementation, one micro IC is disposed corresponding to each of the pixels. The micro IC is disposed adjacent to the pixel corresponding to the micro IC. The micro IC is electrically connected, by using the RDL, to the micro LED chip in the pixel corresponding to the micro IC. In this way, each micro IC independently controls one pixel, forming a one-to-one control solution.

In an implementation, one micro IC is disposed corresponding to a plurality of pixels. The micro IC is disposed between the plurality of pixels corresponding to the micro IC. The micro IC is electrically connected, by using the RDL, to the micro LED chip in the plurality of pixels corresponding to the micro IC. In this way, each micro IC independently controls the plurality of pixels, forming a one-to-many control solution. This can reduce a quantity of micro ICs.

In an implementation, when the micro IC is located on the upper surface of the RDL, the electrode of the micro IC and the electrode of the micro LED chip are located in a same plane. This fabricates an RDL with a flat and smooth upper surface, to improve display performance of an LED chip packaging module.

In an implementation, the LED chip packaging module further includes a light isolation structure disposed on the upper surface of the RDL. The light isolation structure is distributed between adjacent pixels, and/or the light isolation structure is distributed between adjacent micro LED chips. The light isolation structure prevents light ray leakage from gaps between the pixels and the micro LED chips, reduces crosstalk between the pixels, increases or converges a visual angle of light emitting of the micro LED chip, improves light emitting efficiency, and improves display effect.

In an implementation, the LED chip packaging module further includes a transparent packaging layer disposed on the upper surface of the RDL. The transparent packaging layer covers a surface of the micro LED chip and/or the micro IC. The transparent packaging layer may fasten positions of the micro LED chip and/or the micro IC to each other and protect the micro LED chip and/or the micro IC.

In an implementation, the transparent packaging layer includes, on a side far away from the RDL, a packaging plane parallel to the upper surface of the RDL. A micro-nano structure is disposed on the packaging plane. The micro-nano structure improves light emitting efficiency of the micro LED chip, improves a light emitting field pattern, or improves other optical features.

In an implementation, the LED chip packaging module further includes a color conversion material. Surfaces of some or all of the micro LED chips are coated with the color conversion material, to convert chromatic light emitted by the micro LED chips into another color. The color conversion material can enable a monochromatic micro LED chip to emit different chromatic light, reduce use of micro LED chips of different colors during fabrication of the LED chip packaging module, or implement light emitting correction on the LED chip packaging module in a later phase.

In an implementation, the pixel includes N primary micro LED chips and N secondary micro LED chips that are in a one-to-one correspondence with the N primary micro LED chips. The secondary micro LED chip is configured to take over the job of the corresponding primary micro LED chip when the corresponding primary micro LED chip fails, and N is a positive integer. In this way, when any primary micro LED chip fails, the micro IC may drive a secondary micro LED chip of a same color to take over the job of the failed micro LED chip, so that the pixel can still display a color normally, thereby maintaining display integrity of the LED chip packaging module and improving yield of the LED chip packaging module.

In an implementation, the pixel includes N primary micro LED chips and a secondary micro LED chip. The secondary micro LED chip is configured to take over, when any one of the primary micro LED chips fails, the job of the failed primary micro LED chip, and N is a positive integer. In this way, when any primary micro LED chip fails, a transparent packaging layer around the secondary micro LED chip may first be removed by using a laser. Then, a color conversion material whose color is the same as that of the failed micro LED chip is sprayed on, so that after being driven by the micro IC, the secondary micro LED chip can emit chromatic light whose color is the same as that of the failed micro LED chip. Therefore, the pixel can still normally display a color, and a quantity of secondary micro LED chips is reduced.

In an implementation, the pixel includes N primary micro LED chips. A secondary micro LED chip is further included between adjacent two pixels. The secondary micro LED chip is configured to take over, when any one of the primary micro LED chips in adjacent two pixels fails, the job of the failed primary micro LED chip, and N is a positive integer. In this way, when any primary micro LED chip fails, a transparent packaging layer around the secondary micro LED chip may first be removed by using a laser. Then, a color conversion material whose color is the same as that of the failed micro LED chip is sprayed on, so that after being driven by the micro IC, the secondary micro LED chip can emit chromatic light whose color is the same as that of the failed micro LED chip. Therefore, the pixel can still normally display a color, and a quantity of secondary micro LED chips is reduced.

In an implementation, when a light ray emitted by the micro LED chip to an external environment does not pass through the RDL, an insulation flat layer of the RDL is a non-transparent material. In this way, the RDL can absorb or reflect the light ray emitted by the micro LED chip, to improve luminosity.

In an implementation, when a light ray emitted by the micro LED chip to an external environment passes through the RDL, an insulation flat layer of the RDL is a transparent material. In this way, the light ray emitted by the micro LED chip can efficiently pass through the RDL, to improve luminosity.

According to a second aspect, an embodiment of this disclosure provides another LED chip packaging module, including:

a re-distribution layer RDL, where a plurality of first pads are disposed on a lower surface of the RDL; and a micro light emitting diode micro LED chip disposed on an upper surface of the RDL, where an electrode of the micro LED chip faces the RDL and is connected to the RDL. The first pad is electrically connected to the micro LED chip by using the RDL. The first pad is configured to receive an external drive signal. The external drive signal is used to control a working state of the micro LED chip. When the micro LED chip packaging module provided in this embodiment of this disclosure is driven by an external drive signal, the drive signal is directly sent to at least one micro LED chip by using a pad and the RDL, so that one drive signal controls one or more micro LED chips. In this way, a pad configured for directly connecting the electrode of the micro LED chip to external devices such as a drive backplane does not need to be disposed on the LED chip packaging module. This can reduce a quantity of pads between the micro LED chip packaging module and the external devices such as the drive backplane. Therefore, for the LED chip packaging module and the drive backplane that have a same size, a size of each pad may be larger, to greatly reduce bonding difficulty between the LED chip packaging module and the drive backplane, and improve a product yield.

In an implementation, the micro LED chip forms a plurality of pixels, and each of the pixels includes at least one micro LED chip. Therefore, one or more micro LED chips may flexibly form pixels with different color capabilities, for example, full-color pixels and monochromatic pixels.

In an implementation, each of the first pads is electrically connected to the micro LED chip of at least one of the pixels by using the RDL. In this way, the external drive signal may be sent to a micro LED chip in one or more pixels by using the first pad and the RDL, to control a display status of the one or more pixels.

In an implementation, the LED chip packaging module further includes a light isolation structure disposed on the upper surface of the RDL. The light isolation structure is distributed between adjacent pixels, and/or the light isolation structure is distributed between adjacent micro LED chips. The light isolation structure prevents light ray leakage from gaps between the pixels and the micro LED chips, reduces crosstalk between the pixels, increases or converges a visual angle of light emitting of the micro LED chip, improves light emitting efficiency, and improves display effect.

In an implementation, the LED chip packaging module further includes a transparent packaging layer disposed on the upper surface of the RDL. The transparent packaging layer covers a surface of the micro LED chip. The transparent packaging layer may fasten positions of the micro LED chip and/or the micro IC to each other and protect the micro LED chip and/or the micro IC.

In an implementation, the transparent packaging layer includes, on a side far away from the RDL, a packaging plane parallel to the upper surface of the RDL. A micro-nano structure is disposed on the packaging plane. The micro-nano structure improves light emitting efficiency of the micro LED chip, improves a light emitting field pattern, or improves another optical feature.

According to a third aspect, an embodiment of this disclosure provides an LED chip packaging method, including:

detachably disposing a micro LED chip and a micro IC on a first base plate, where an electrode of the micro LED chip and an electrode of the micro IC are disposed to face the first base plate; coating surfaces of the micro LED chip, the micro IC, and the first base plate with a transparent packaging layer; after the transparent packaging layer is cured, removing the first base plate, so that the transparent packaging layer forms a first plane that exposes the electrode of the micro LED chip and the electrode of the micro IC; fabricating an RDL on the first plane, where the micro IC is electrically connected to the micro LED chip by using the RDL; and fabricating a first pad on a lower surface that is of the RDL and that is away from the transparent packaging layer. The first pad is electrically connected to the micro IC by using the RDL. The first pad is configured to receive an external drive signal. The micro IC is configured to control, based on the external drive signal, a working state of the micro LED chip electrically connected to the micro IC. When the micro LED chip packaging module fabricated according to the method provided in this embodiment of this disclosure is driven by an external drive signal, the drive signal first controls the micro IC, and then the micro IC controls, based on the drive signal, a working state of at least one micro LED chip connected to the micro IC. In this way, a pad configured for connecting an electrode of the micro LED chip to external devices such as a drive backplane does not need to be disposed on the LED chip packaging module. This can reduce a quantity of pads between the micro LED chip packaging module and the external devices such as the drive backplane. Therefore, for the LED chip packaging module and the drive backplane that have a same size, a size of each pad may be larger, to greatly reduce bonding difficulty between the LED chip packaging module and the drive backplane, and improve product yield.

In an implementation, the detachably disposing a micro LED chip and a micro IC on a first base plate includes: disposing a plurality of micro LED chips on the first base plate to form a plurality of pixels. Each of the pixels includes at least one of the micro LED chips, and one micro IC is disposed adjacently on one side of each of the pixels. Therefore, one or more micro LED chips may flexibly form pixels with different color capabilities, for example, full-color pixels and monochromatic pixels. In addition, the pixels and micro ICs are configured in a one-to-one correspondence.

In an implementation, the RDL electrically connects the micro LED chip in each of the pixels to the micro IC adjacent to the micro LED chip. Therefore, each micro IC independently controls one pixel, forming a one-to-one control solution.

In an implementation, the detachably disposing a micro LED chip and a micro IC on a first base plate includes: disposing a plurality of micro LED chips on the first base plate to form a plurality of pixels, where each of the pixels includes at least one of the micro LED chips, and disposing at least one micro IC between a plurality of pixels. Therefore, one or more micro LED chips may flexibly form pixels with different color capabilities, for example, full-color pixels and monochromatic pixels. In addition, the pixels and micro ICs are configured in a one-to-many correspondence.

In an implementation, the RDL electrically connects each micro IC to the micro LED chip in at least one of the pixels. In this way, each micro IC independently controls the plurality of pixels, forming a one-to-many control solution. This can reduce a quantity of micro ICs.

In an implementation, before the coating surfaces of the micro LED chip, the micro IC, and the first base plate with a transparent packaging layer, the method further includes: fabricating a light isolation structure on the surface of the first base plate. The light isolation structure may be disposed between adjacent pixels, or may be disposed between adjacent micro LED chips. The light isolation structure prevents light ray leakage from gaps between the pixels and the micro LED chips, reduces crosstalk between the pixels, increases or converges a visual angle of light emitting of the micro LED chip, improves light emitting efficiency, and improves display effect.

In an implementation, before the coating surfaces of the micro LED chip, the micro IC, and the first base plate with a transparent packaging layer, the method further includes: coating surfaces of some or all of the micro LED chips with a color conversion material. The color conversion material is used to convert chromatic light emitted by the micro LED chips into another color. The color conversion material can enable a monochromatic micro LED chip to emit different chromatic light, reduce use of micro LED chips of different colors during fabrication of the LED chip packaging module, or implement light emitting correction on the LED chip packaging module in a later phase.

In an implementation, after the coating surfaces of the micro LED chip, the micro IC, and the first base plate with a transparent packaging layer, the method further includes: polishing a side that is of the transparent packaging layer and that is away from the first base plate, to form a packaging plane parallel to the first base plate; and fabricating a micro-nano structure on the packaging plane. The micro-nano structure improves light emitting efficiency of the micro LED chip, improves a light emitting field pattern, or improves other optical features.

In an implementation, a first attachment layer is disposed on the surface of the first base plate, and the first attachment layer is configured to detachably dispose the micro LED chip and the micro IC. In this way, the micro LED chip and the micro IC may be temporarily fastened on the first base plate by using the first attachment layer.

In an implementation, before the detachably disposing a micro LED chip and a micro IC on a first base plate, the method further includes: growing a micro LED epitaxial wafer structure on a surface of a substrate; fabricating the epitaxial wafer structure into a plurality of micro LED chips in a standard semiconductor fabrication process; turning over the substrate and the micro LED chip on the substrate as a whole, and then detachably disposing the substrate and the micro LED chip on a second base plate; and removing the substrate. In this way, the plurality of micro LED chips that are disposed independently of each other may be obtained at a time.

In an implementation, a second attachment layer is disposed on a surface of the second base plate, and the second attachment layer is configured to detachably disposing the micro LED chip. In this way, the micro LED chip may be temporarily fastened on the second base plate by using the first attachment layer.

In an implementation, the detachably disposing a micro LED chip and a micro IC on a first base plate includes: attaching a plurality of micro LED chips from the second base plate at a time, disposing the plurality of attached micro LED chips on the first base plate, attaching, at a time, at least one micro IC from a third base plate on which the micro IC is detachably disposed, and disposing the attached micro IC on the first base plate. This implements mass transfer of the micro LED chip and the micro IC, and improves fabrication efficiency of the LED chip packaging module.

According to a fourth aspect, an embodiment of this disclosure provides another LED chip packaging method, including:

detachably disposing a micro LED chip on a first base plate, where an electrode of the micro LED chip is disposed to face the first base plate; coating surfaces of the micro LED chip and the first base plate with a transparent packaging layer; after the transparent packaging layer is cured, removing the first base plate, so that the transparent packaging layer forms a first plane that exposes the electrode of the micro LED chip; fabricating an RDL on the first plane, and mounting the micro IC on a lower surface that is of the RDL and that is away from the transparent packaging layer, where an electrode of the micro IC is disposed to face the RDL, and the micro IC is electrically connected to the micro LED chip by using the RDL; and fabricating a first pad on the lower surface of the RDL. The first pad is electrically connected to the micro IC by using the RDL. The first pad is configured to receive an external drive signal. The micro IC is configured to control, based on the external drive signal, a working state of the micro LED chip electrically connected to the micro IC. When the micro LED chip packaging module fabricated according to the method provided in this embodiment of this disclosure is driven by an external drive signal, the drive signal first controls the micro IC, and then the micro IC controls, based on the drive signal, a working state of at least one micro LED chip connected to the micro IC. In this way, a pad configured for connecting an electrode of the micro LED chip to external devices such as a drive backplane does not need to be disposed on the LED chip packaging module. This can reduce a quantity of pads between the micro LED chip packaging module and the external devices such as the drive backplane. Therefore, for the LED chip packaging module and the drive backplane that have a same size, a size of each pad may be larger, to greatly reduce bonding difficulty between the LED chip packaging module and the drive backplane, and improve a product yield.

In an implementation, a plurality of micro LED chips are disposed on the first base plate to form a plurality of pixels, and each of the pixels includes at least one of the micro LED chips. Therefore, one or more micro LED chips may flexibly form pixels with different color capabilities, for example, full-color pixels and monochromatic pixels.

In an implementation, the RDL electrically connects each micro IC to the micro LED chip in at least one of the pixels. Therefore, each micro IC independently controls one pixel, forming a one-to-one control solution. Each micro IC independently controls the plurality of pixels, forming a one-to-many control solution. This can reduce a quantity of micro ICs.

In an implementation, the coating surfaces of the micro LED chip and the first base plate with a transparent packaging layer further includes: fabricating a light isolation structure on the surface of the first base plate. The light isolation structure may be disposed between adjacent pixels, or may be disposed between adjacent micro LED chips. The light isolation structure prevents light ray leakage from gaps between the pixels and the micro LED chips, reduces crosstalk between the pixels, increases or converges a visual angle of light emitting of the micro LED chip, improves light emitting efficiency, and improves display effect.

In an implementation, after the coating surfaces of the micro LED chip and the first base plate with a transparent packaging layer, the method further includes: polishing a side that is of the transparent packaging layer and that is away from the first base plate, to form a packaging plane parallel to the first base plate; and fabricating a micro-nano structure on the packaging plane. The micro-nano structure improves light emitting efficiency of the micro LED chip, improves a light emitting field pattern, or improves another optical feature.

According to a fifth aspect, an embodiment of this disclosure provides still another LED chip packaging method, including:

detachably disposing a micro LED chip on a first base plate, where an electrode of the micro LED chip is disposed to face the first base plate; coating surfaces of the micro LED chip and the first base plate with a transparent packaging layer; after the transparent packaging layer is cured, removing the first base plate, so that the transparent packaging layer forms a first plane that exposes the electrode of the micro LED chip; and fabricating an RDL on the first plane, and fabricating a first pad on a lower surface that is of the RDL and that is away from the transparent packaging layer. The first pad is electrically connected to the micro LED chip by using the RDL. The first pad is configured to receive an external drive signal. The external drive signal is used to control a working state of the micro LED chip electrically connected to the first pad. When the micro LED chip packaging module fabricated according to the method provided in this embodiment of this disclosure is driven by an external drive signal, the drive signal is directly sent to at least one micro LED chip by using a pad and the RDL, so that one drive signal controls one or more micro LED chips. In this way, a pad configured for directly connecting the electrode of the micro LED chip to external devices such as a drive backplane does not need to be disposed on the LED chip packaging module. This can reduce a quantity of pads between the micro LED chip packaging module and the external devices such as the drive backplane. Therefore, for the LED chip packaging module and the drive backplane that have a same size, a size of each pad may be larger, to greatly reduce bonding difficulty between the LED chip packaging module and the drive backplane, and improve product yield.

In an implementation, a plurality of micro LED chips are disposed on the first base plate to form a plurality of pixels, and each of the pixels includes at least one of the micro LED chips. Therefore, one or more micro LED chips may flexibly form pixels with different color capabilities, for example, full-color pixels and monochromatic pixels.

In an implementation, the coating surfaces of the micro LED chip and the first base plate with a transparent packaging layer further includes: fabricating a light isolation structure on the surface of the first base plate. The light isolation structure may be disposed between adjacent pixels, or may be disposed between adjacent micro LED chips. The light isolation structure prevents light ray leakage from gaps between the pixels and the micro LED chips, reduces crosstalk between the pixels, increases or converges a visual angle of light emitting of the micro LED chip, improves light emitting efficiency, and improves display effect.

In an implementation, after the coating surfaces of the micro LED chip and the first base plate with a transparent packaging layer, the method further includes: polishing a side that is of the transparent packaging layer and that is away from the first base plate, to form a packaging plane parallel to the first base plate; and fabricating a micro-nano structure on the packaging plane. The micro-nano structure improves light emitting efficiency of the micro LED chip, improves a light emitting field pattern, or improves another optical feature.

According to a sixth aspect, an embodiment of this disclosure provides a display, including: a drive backplane, a display driver integrated circuit DDIC configured to generate an external drive signal, and at least one LED chip packaging module according to any one of the first aspect, the second aspect, and the implementations of the first aspect and the second aspect. The DDIC and the at least one LED chip packaging module are disposed on the drive backplane. The drive backplane includes a second pad at a position corresponding to that of a first pad of the at least one LED chip packaging module. The second pad is connected to the DDIC by using a line. The first pad is configured for the LED chip packaging module to receive the external drive signal. The first pad is soldered to the second pad. The LED chip packaging module provided in embodiments of this disclosure has a smaller quantity of first pads, and a smaller quantity of second pads may be correspondingly disposed on the drive backplane. This reduces soldering difficulty between the LED chip packaging module and the drive backplane, and improves display yield.

According to a seventh aspect, an embodiment of this disclosure provides an electronic device, including the display provided in the sixth aspect.

BRIEF DESCRIPTION OF DRAWINGS

FIG. 3 is a flowchart of an LED chip packaging method according to an embodiment of this disclosure;

FIGS. 22(a) and 22(b) are schematic diagrams of still other arrangements of a micro LED chip and a micro IC;

FIG. 23 is a schematic diagram of still another structure of an LED chip packaging module according to an embodiment of this disclosure;

DESCRIPTION OF EMBODIMENTS

Figure 1:
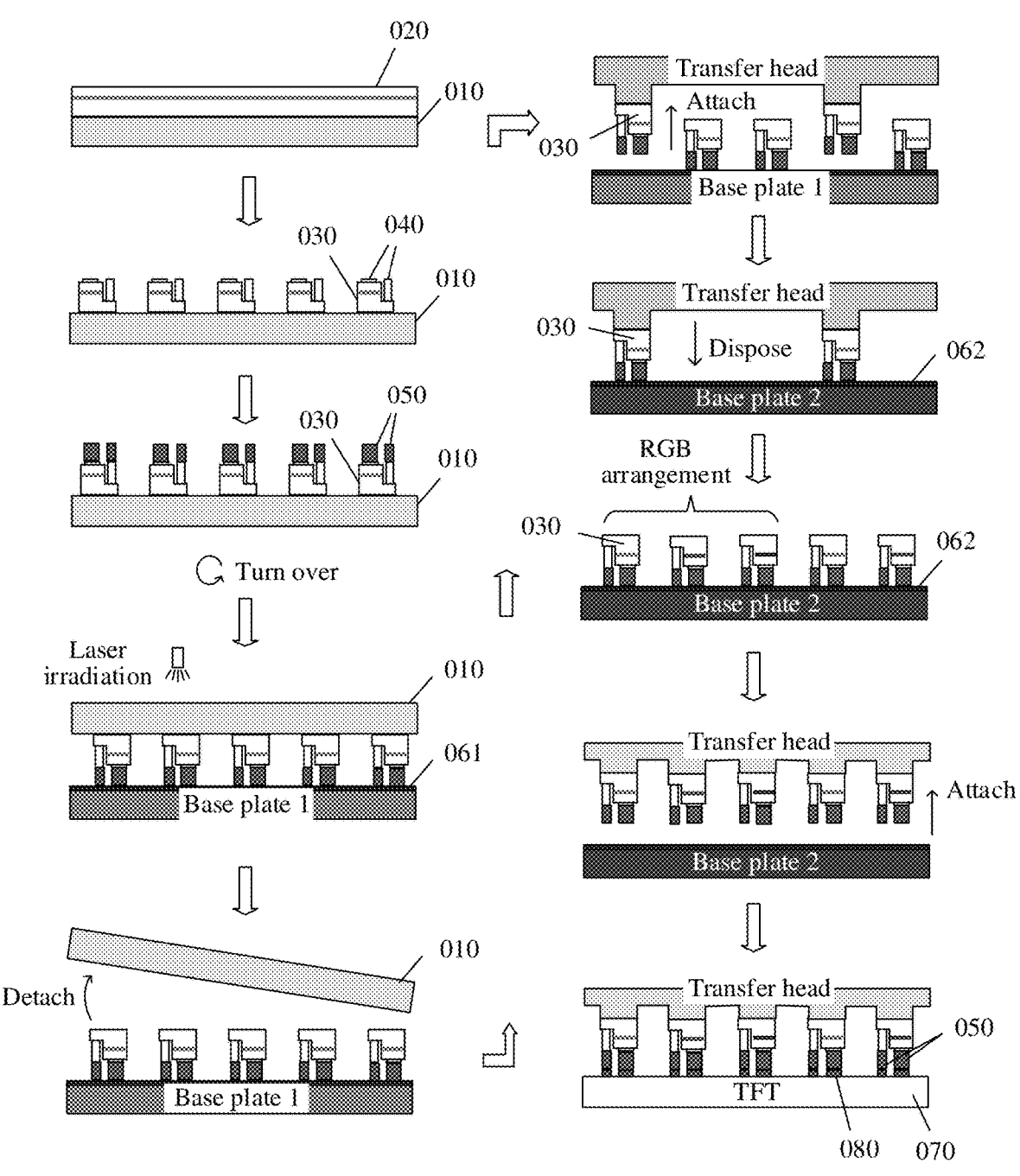
FIG. 1 is a schematic flowchart of a prior art massive transfer and micro-nano bonding process of a micro LED.

To facilitate understanding of technical solutions in embodiments of this disclosure, before specific implementations of embodiments of this disclosure are described, some technical terms in the technical field to which embodiments of this disclosure belong are first briefly described.

Gallium nitride (GaN) is a compound of nitrogen and gallium. It is a binary III/V direct bandgap semiconductor commonly used in light-emitting diodes.

Metallic organic chemical vapor deposition (MOCVD) is a method for growing semiconductor thin films on base plates. The method may also be referred to as metal-organic vapor-phase epitaxy (MOVPE), organometallic vapor-phase epitaxy (OMVPE), and organometallic chemical vapor deposition (OMCVD). The "MO" or "OM" indicates that a precursor used in a growing process of a semiconductor thin film is a metal compound "metal-organic" or an organic metal compound. The following three letters "CVD" or "VPE" indicates that the grown semiconductor thin film is an amorphous thin film or a crystalline thin film.

A re-distribution layer (RDL) is a metal layer additionally disposed on a chip, so that an electrode or an input/output pad (I/O pad) of the chip can be re-disposed at another position of the chip, to connect to another integrated circuit or chip, or to connect to an electrode or I/O pad of a different chip.

A display driver integrated circuit (DDIC) may generally include a microcontroller, a microprocessor, and an interface for a peripheral device, and is configured to generate a proper voltage, current, time sequence signal, or the like to drive pixels of a display, so that the display generates a corresponding image.

A surface-mount technology (SMT) is an electronic assembly technology. In this technology, electronic devices, such as resistors, capacitors, transistors, and integrated circuits, are mounted on a printed circuit board and form an electrical connection through brazing or soldering. Therefore, no through holes need to be reserved for pins of the devices. The devices used are also referred to as surface-mount devices (SMD).

Crosstalk, also referred to as crosstalk interference, indicates a coupling between two signal lines. A reason is that signal lines that are close to each other may interfere with each other due to undesired inductive and capacitive couplings. The capacitive coupling causes a coupling current, and the inductive coupling causes a coupling voltage.

Epitaxy, also referred to as epitaxial growth, is a technology used in a semiconductor device fabrication process to fabricate a new semiconductor layer by growing a new crystal on an original chip. A crystal or grain grown according to an epitaxy technology may also be referred to as an epitaxy, an epitaxial layer, or an epitaxial wafer.

A micro-nano structure is a functional structure that is manually designed, has a micron or nanoscale size, and is disposed in a specific manner.

A micro LED is also referred to as a micro light emitting diode, and is a self-light-emitting lighting device possibly applied to a next-generation display technology after a liquid crystal display (LCD) and an active-matrix organic light-emitting diode (AMOLED). A core technology of a micro LED display combines millions to tens of millions of LED chips with sizes of tens of microns to form pixels of the display. Therefore, a process of the micro LED display is greatly different from a process of combining an LED and a backlight layer by using a liquid crystal layer, and a vapor deposition process of an organic material for an AMOLED.

Since an LED chip is a semiconductor device, structures such as metal electrodes on a surface of the LED chip may be processed in a semiconductor fabrication process. If the LED chip is to be sequentially arranged, according to design, on a drive backplane of a thin film transistor (TFT), a passive matrix (PM) line, or the like, mass transfer, micro bonding, and other processes are used to transfer and fasten the LED chip on the drive backplane. Different from conventional LED packaging processes in which only one single LED chip is transferred each time, in a mass transfer technology, a polydimethylsiloxane (PDMS) base material or another transfer head or stamp simultaneously transfers tens of thousands to hundreds of thousands of LED chips, to meet an output requirement for transferring more than a million LED chips in a short time period. A size of a micro LED chip is only tens of microns. In a future objective for mass production, the size of the micro LED chip is expected to be reduced to 5 to 10 microns. Therefore, a size of a micro bump fabricated on the micro LED chip and a bonding process also needs to be reduced to less than 10 microns. In a conventional micro LED chip fabrication technology, it is difficult to meet such a process requirement.

The following briefly describes a prior art mass transfer and micro-nano bonding process of a micro LED with reference to accompanying drawings, so that a person skilled in the art can understand a technical scenario of embodiments of this disclosure and a disadvantage of the mass transfer and micro-nano bonding process during application of the micro LED.

FIG. 1 is a schematic flowchart of a prior art massive transfer and micro-nano bonding process of a micro LED. As shown in FIG. 1, a micro LED chip (for example, a blue or green micro LED chip) made of a GaN/InGaN material is used as an example. To obtain a structure of the micro LED chip, an LED epitaxial wafer structure (LED epi-layer) 020 may be first grown on a surface of a substrate 010 made of a sapphire sub material. Then, the epitaxial wafer structure 020 is fabricated into a large number of micro LED chips 030 with sizes of about 10 microns in a standard semiconductor fabrication process. In addition to an ohmic electrode 040 (the ohmic electrode 040 includes a P/N electrode of the LED chip) fabricated to reduce a current flowing into a semiconductor, a micro bump 050 prepared for a subsequent bonding process needs to be fabricated on a surface of the micro LED chip 030. The micro bump 050 is prepared on the ohmic electrode 040. To reduce a temperature required by the bonding process, the micro bump may be made of a low-temperature bonding metal alloy including indium (In), tin (Sn), and copper (Cu). After a chip fabrication process is completed, the substrate 010 and the epitaxial wafer structure 020 on the substrate 010 may be turned over and attached to a base plate 1. The base plate carrier 1 may be made of a material such as glass, and a surface of the base plate carrier 1 has an attachment layer 061. The attachment layer 061 is in contact with the micro bump 050, to temporarily fasten the epitaxial wafer structure 020 without damaging a device structure. Next, to remove the sapphire substrate 010, a laser may be used to irradiate the epitaxial wafer structure 020 from the sapphire substrate 010. A wavelength of the laser is not absorbed by the sapphire substrate 010, but reacts with the GaN material. In this way, the epitaxial wafer structure 020 is separated from the sapphire substrate 010.

After the epitaxial wafer structure 020 is separated from the sapphire substrate 010, the micro LED chip 030 is separately attached to the base plate carrier 1. In this case, a required micro LED chip 030 may be selectively attached or absorbed from the base plate carrier 1 by using a patterned transfer head (stamp). The stamp may be made by using a van der Waals force PDMS material. Alternatively, the micro LED chip 030 may be absorbed by using other mechanisms such as electrostatic force and magnetic force. After the micro LED chip 030 is attached by using the stamp, the micro LED chip 030 may be transferred to another base plate carrier 2. A surface of the base plate carrier 2 also has an attachment layer 062 or an attachment apparatus, to temporarily fasten the micro LED chip 030. Generally, to enable the PDMS stamp to smoothly attach the micro LED chip 030 from the base plate carrier 1 and to smoothly and temporarily fasten the micro LED chip 030 on the base plate carrier 2, the attachment force should meet: attachment layer 061<PDMS<attachment layer 062. Therefore, the attachment layer 061 and the attachment layer 062 may be made of different materials. Transferring the micro LED chip 030 from the base plate carrier 1 to the base plate carrier 2 by using the stamp has the following objectives, including: adjusting a spacing between the micro LED chips 030, making the micro LED chips 030 form a full-color arrangement (for example, a red, green, and blue RGB arrangement) on the surface of the base plate carrier 2, or performing a double-sided fabrication process of another chip.

After the micro LED chips 030 are arranged on the surface of the base plate carrier 2, all the micro LED chips 030 may be attached at a time by using another stamp and transferred to a corresponding area of a drive backplane 070. Then, the micro bump 050 is used to enable positive and negative electrodes of the surface of the micro LED chip 030 to be mechanically and electrically connected to corresponding electrodes 080 on the drive backplane. The following process procedure is generally used herein: The positive and negative electrodes of the surface of the micro LED chip 030 are aligned with the corresponding electrodes 080 on the drive backplane. The micro LED chip 030 is pressed and heated to soften a solder material of the micro bump 050, so that the positive and negative electrodes of the surface of the micro LED chip 030 are connected to and share metal with the corresponding electrodes 080 on the drive backplane, and the temperature is reduced.

It may be understood that the micro bump and bonding process shown in FIG. 1 can implement an electrical connection between the positive and negative electrodes on the surface of the micro LED chip and the corresponding electrodes on the drive backplane. However, the size of the micro LED chip is increasingly miniaturized. When the size of the micro LED chip is reduced to an extent, for example, 10 to 15 microns or less, it is difficult for the micro bump and bonding process shown in FIG. 1 to overcome problems in process implementation and production yield. Details are as follows:

1. The micro bump generally includes solder materials such as indium (In) or tin (Sn), which reduces bonding temperature. However, these materials are also prone to diffuse in an alloy. To prevent the solder material from diffusing to an ohmic metal layer, which affects a device feature and a yield, a gold (Au) or another metal layer in the micro bump usually needs to be thickened, which is not conducive to miniaturization of the micro LED chip. In addition, when the micro LED chip is connected to the drive backplane in the bonding process, the chip and the drive backplane are mechanically and electrically connected by using the micro bump. Changes in parameters such as a contact status between the stamp and the chip, pressure and temperature evenness, and cooling in the bonding process may cause changes in a distance, an angle, and a direction between the chip and the backplane. As a result, a field pattern of each micro LED chip is slightly different. A user may perceive pixel disorder when viewing the display.

2. The micro LED chip cannot be detected before all processes are completed. The micro LED chip can be powered on and a feature analysis and test can be performed only after the micro LED chip is connected to the drive backplane. Therefore, after all the processes shown in FIG. 1 are completed, if the test shows that the micro LED chip fails due to the micro LED chip itself or a process problem, a non-defective micro LED display can be obtained only after a repair process. However, the repair process relates to removal of the failed micro LED chip, pad cleaning, resetting, transfer and bonding of a single micro LED chip, and other processes. It is technologically difficult to implement the repair process in a production environment, and each pixel takes labor hours far greater than labor hours for mass transfer. In addition, to avoid the repair process, a possible approach is to provide a secondary chip (redundancy). In short, in a redundancy approach, a quantity of secondary micro LED chips is doubled on the micro LED display. When an original micro LED chip fails and cannot operate, a secondary chip takes over the job of the original micro LED chip to maintain complete full-screen light emitting. It is clear that this approach increases production costs of the display and reduces resolution of the display.

Figure 2:
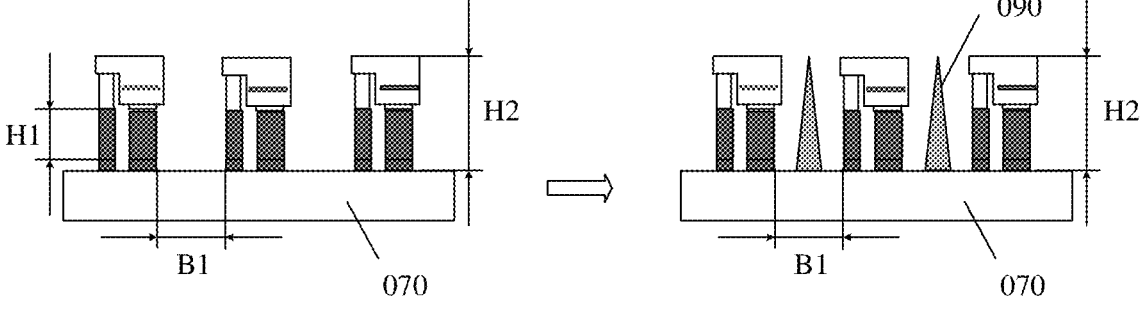
FIG. 2 is a schematic diagram of a prior art inter-pixel optical structure.

3. An optical process between micro LED chips or a volumization process of another device is difficult. As shown in FIG. 2, in addition to a thickness of a micro LED chip, a thickness of a micro bump needs to be added to each pixel on the micro LED display to form a total thickness of the pixel. Generally, to improve a fault tolerance and a yield of bonding, the thickness H1 of the micro bump may reach 5 to 8 microns. If the thickness of the micro LED chip is added, a total thickness H2 of each pixel may reach 10 to 15 microns or even higher. In this case, a depth-to-width ratio of the total thickness H2 of the pixel to a distance B1 between pixels is high. For example, if an optical structure 090 that changes a light type or reduces crosstalk is fabricated between the pixels, the excessively high depth-to-width ratio may cause a decrease in precision and a yield of a semiconductor process such as inter-pixel photoetching, and may also adversely affect a volumization objective of another sensing device.

To resolve the foregoing technical problem, an embodiment of this disclosure provides an LED chip packaging method. The method may be applied to the field of packaging various LED chips. For example, a micro LED chip or a mini LED chip is packaged on a base plate such as a TFT, to fabricate a micro LED or a mini LED chip packaging module, a display, or the like.

The following describes in detail the method provided in this embodiment of this disclosure by using an example in which a micro LED chip is packaged to fabricate a micro LED chip packaging module. It may be understood that the following method steps are also applicable to a packaging process of a mini LED chip or another LED chip.

Figure 4:
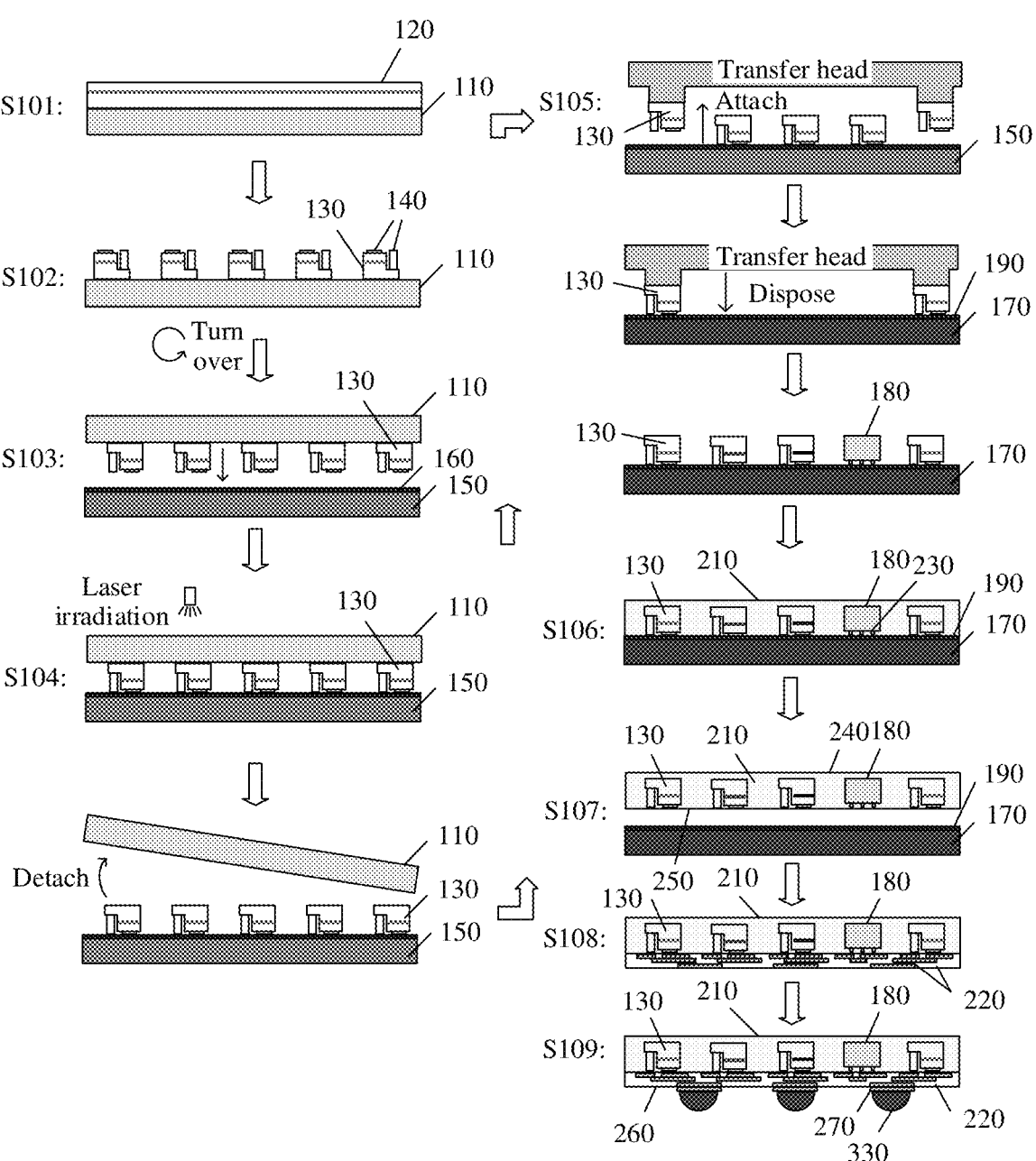
FIG. 4 is a schematic diagram of a structure formed according to steps of an LED chip packaging method according to an embodiment of this disclosure.

FIG. 3 and FIG. 4 are respectively a flowchart and a schematic diagram of a structure formed according to steps of an LED chip packaging method according to an embodiment of this disclosure.

As shown in FIG. 3 and FIG. 4, the method may include the following steps.

Step S101: Grow a micro LED epitaxial wafer structure 120 on a surface of a substrate 110.

A material that can be used as the substrate 110 of the epitaxial wafer structure 120 may include, for example, sapphire, aluminum nitride AlN, silicon carbide SiC, a GaN single crystal material, and another material. This is not limited in this disclosure.

In a specific implementation, an epitaxial material used to grow the epitaxial wafer structure 120 may be determined based on a desired color of light emitted by a micro LED chip. For example, if a micro LED chip emitting blue chromatic light or green chromatic light needs to be prepared, a GaN/InGaN material may be used to grow the epitaxial wafer structure 120. For another example, if a micro LED chip emitting red chromatic light needs to be prepared, a material such as GaAsP may be used to grow the epitaxial wafer structure 120. Other materials that can be used to grow the epitaxial wafer structure 120 may further include SiC, AlGaP, and the like. Due to a limited length of this specification, details are not further described herein.

Figure 5:
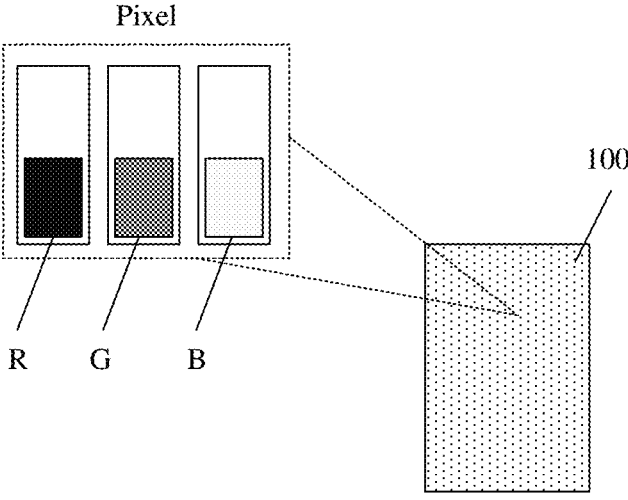
FIG. 5 is a schematic diagram of a full-color pixel of a micro LED display.

It should be additionally noted herein that, as shown in FIG. 5, in a micro LED display 100, each full-color pixel may include a plurality of micro LED chips. In an example of a most basic pixel structure, the pixel structure may include a micro LED chip R whose epitaxial material emits red chromatic light, a micro LED chip G whose epitaxial material emits green chromatic light, and a micro LED chip B whose epitaxial material emits blue chromatic light. Therefore, to obtain a micro LED chip required by the full-color pixel, different epitaxial wafer structures 120 that can emit different chromatic light may be grown on different substrates 110 by using different epitaxial materials during actual production. For example, GaN/InGaN is used on a substrate 110 to grow an epitaxial wafer structure 120 that can emit blue chromatic light, and GaN/InGaN is used on another substrate 110 to grow an epitaxial wafer structure 120 that can emit green chromatic light.

Step S102: Fabricate the epitaxial wafer structure into a plurality of micro LED chips in a standard semiconductor fabrication process.

In a specific implementation, an extra part of the epitaxial wafer structure 120 may be removed by using etching or another material removal technology. A remaining epitaxial wafer structure 120 forms a plurality of independent structures that have sizes of about 10 microns and are disposed at a spacing on the substrate 110. Then, an ohmic electrode (referred to as "electrode") 140 that can reduce a current flowing into a semiconductor is fabricated on a side that is of each independent structure and that is away from the substrate. In this way, a complete micro LED chip 130 can be formed, and each independent structure finally forms a micro LED chip 130.

Compared with the micro LED chip packaging structure using the micro bump and a soldering process shown in FIG. 1, no micro bumps need to be fabricated for the micro LED chip 130 fabricated in this embodiment of this disclosure except that the electrode 140 is included. This reduces a height of the micro LED chip.

It should be additionally noted that the foregoing size "10 microns" is merely an example size, and does not constitute a specific limitation on the size of the micro LED chip. Generally, the size of the micro LED chip may reach 1 μm to 60 μm. A person skilled in the art may determine a corresponding semiconductor fabrication process based on a common size range of the micro LED chip. This is not limited in this disclosure.

Step S103: Turn over the substrate 110 and the micro LED chips 130 on the substrate as a whole, and then detachably dispose the substrate and the micro LED chips on a second base plate 150.

The second base plate 150 may be made of a material such as glass or a silicon wafer, and a second attachment layer 160 is disposed on a surface of the second base plate 150. After the substrate 110 and the micro LED chips 130 on the substrate 110 are turned over as a whole, the substrate 110 and the micro LED chips 130 on the substrate 110 may be moved to the second base plate 150. In this way, the second attachment layer 160 faces one end that is of the micro LED chip 130 and that has an electrode 140. Next, the substrate 110 and the micro LED chip 130 on the substrate 110 are moved downward. In this way, the electrode 140 of the micro LED chip 130 is in contact with the second attachment layer 160 and is attached to the second base plate 150. The second attachment layer 160 does not fasten the micro LED chip 130 and the second base plate 150 for a long time, and only temporarily and detachably fastens the micro LED chip 130 without damaging a device structure of the micro LED chip 130. In this way, the micro LED chip 130 can be separated from the second base plate 150 when necessary.

Step S104: Remove the substrate.

In a specific implementation, a laser may be used to irradiate the epitaxial wafer structure of the micro LED chip 130 from the substrate 110. A wavelength of the laser enables the laser to pass through the substrate 110 without being absorbed by the substrate 110. The laser reacts with the GaN material of the epitaxial wafer structure, so that the epitaxial wafer structure of the micro LED chip 130 is separated from the substrate 110, thereby removing the substrate 110.

In addition, a person skilled in the art may also separate the substrate 110 from the micro LED chip 130 by using another semiconductor fabrication process. This is not limited in this disclosure.

Step S105: Detachably dispose the micro LED chips 130 and a micro IC 180 on a first base plate 170. The electrode 140 of the micro LED chip 130 and an electrode 230 of the micro IC 180 are disposed to face the first base plate 170.

In an embodiment, a plurality of micro LED chips 130 and the micro IC 180 may be disposed on the first base plate 170 to form a plurality of pixels. Each of the pixels includes at least one of the micro LED chips 130 and one micro IC 180.

Figure 6:
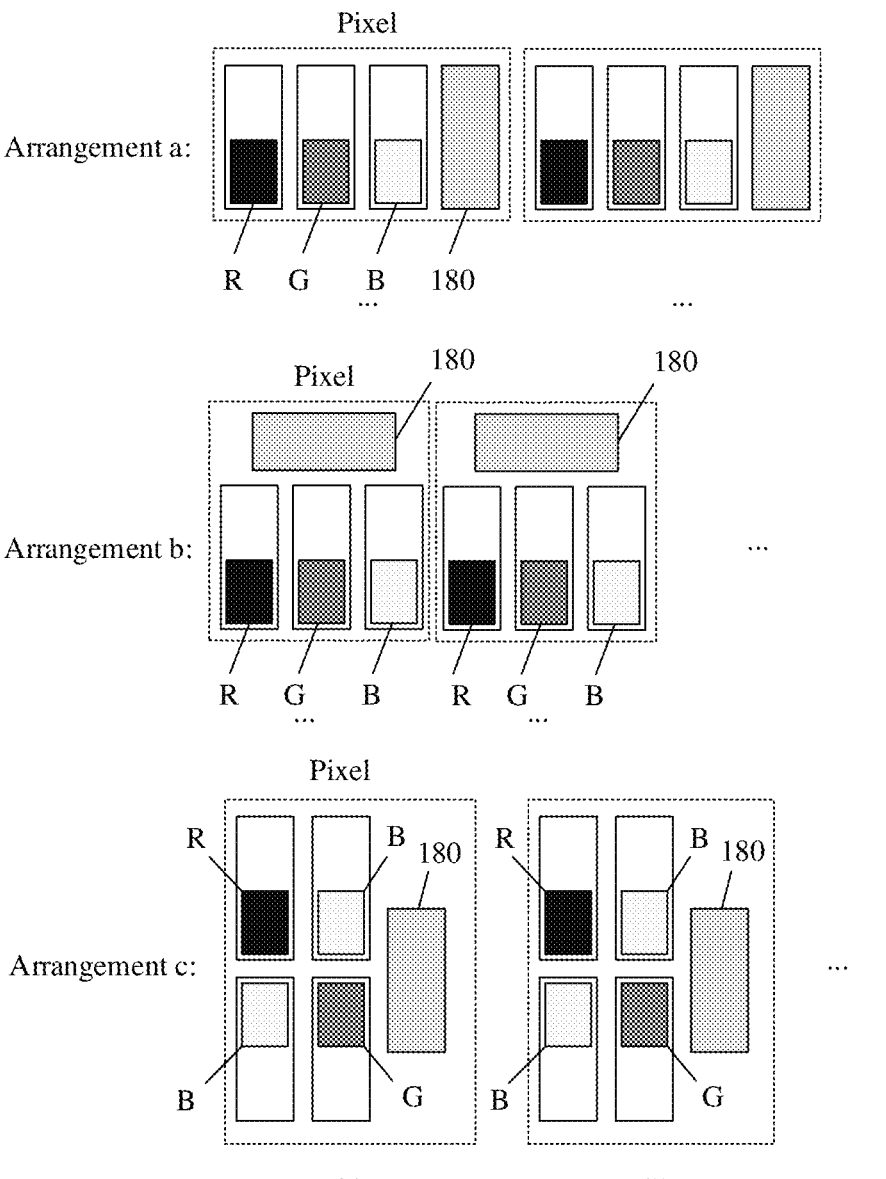
FIGS. 6(a), 6(b), and 6(c) are schematic diagrams of arrangements of a micro LED chip and a micro IC.

For example, as shown in an arrangement of FIG. 6(a), a pixel includes a micro LED chip B emitting blue chromatic light, a micro LED chip G emitting green chromatic light, and a micro LED chip R emitting red chromatic light. The three micro LED chips are arranged in parallel in a row to form a standard RGB arrangement. Each pixel includes a micro IC 180, and the micro IC 180 and the micro LED chip are arranged in parallel in a same row.

For example, as shown in an arrangement in FIG. 6(b), a pixel includes a micro LED chip B emitting blue chromatic light, a micro LED chip G emitting green chromatic light, and a micro LED chip R emitting red chromatic light. The three micro LED chips are arranged in parallel in a row to form a standard RGB arrangement. Each pixel includes one micro IC 180, and the micro IC 180 is disposed above or below the three micro LED chips.

For example, as shown in an arrangement in FIG. 6(c), a pixel may include four micro LED chips, for example, two micro LED chips B emitting blue chromatic light, one micro LED chip R emitting red chromatic light, and one micro LED chip G emitting green chromatic light. The four micro LED chips are arranged in a rectangular manner. A position of each micro LED chip may be considered as a corner of a rectangle. The two micro LED chips B emitting blue chromatic light are disposed in a diagonal manner. Each pixel includes one micro IC 180. The micro IC 180 may be disposed on one side of four micro LED chips.

In another embodiment, a plurality of micro LED chips 130 may be arranged into a plurality of pixels on the first base plate 170. Each pixel includes at least one micro LED chip 130. In addition, at least one micro IC 180 is distributed between these pixels.

Figure 7:
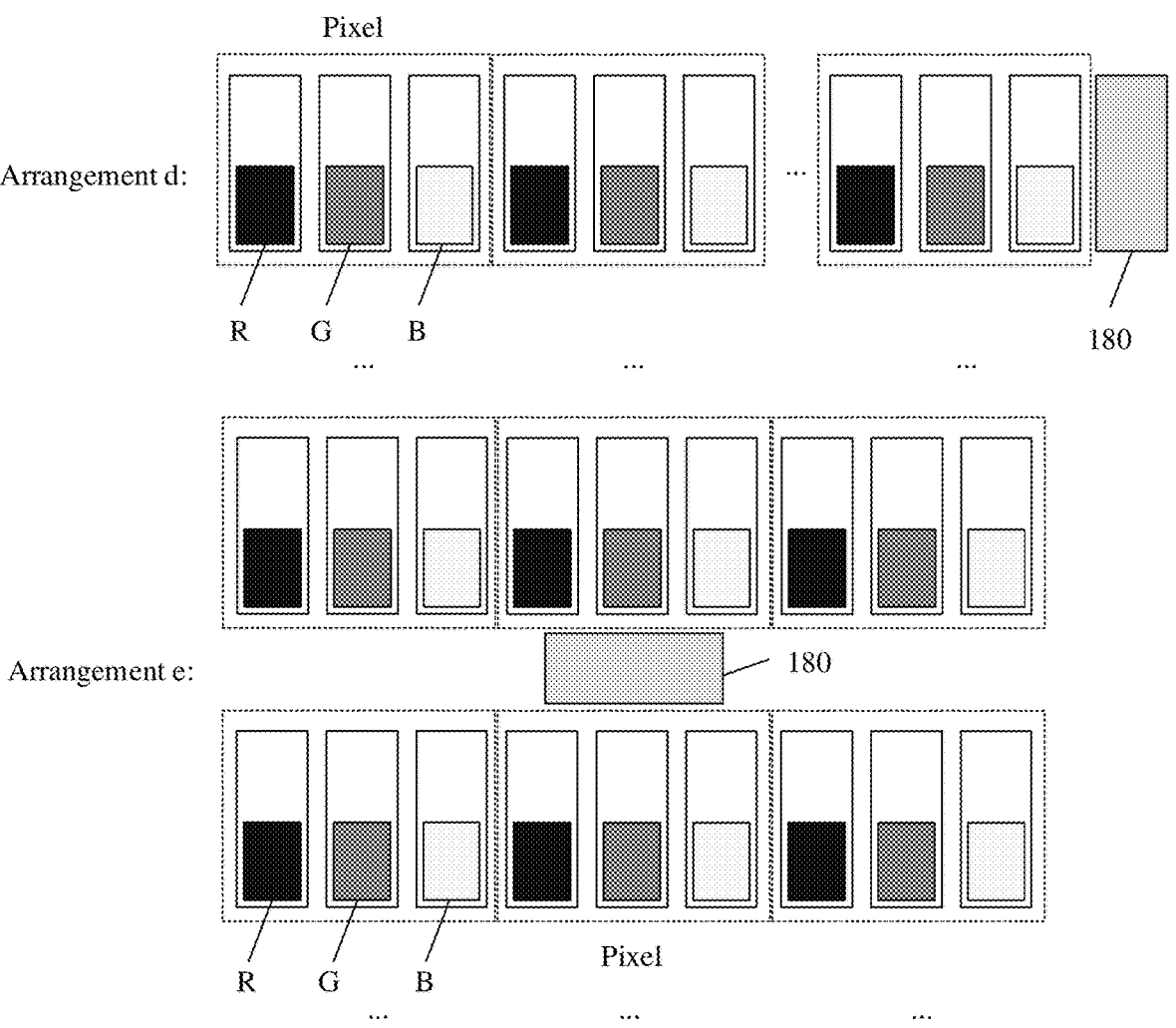
FIGS. 7(a) and 7(b) are schematic diagrams of other arrangements of a micro LED chip and a micro IC.

For example, as shown in an arrangement in FIG. 7(*a*), a pixel includes a micro LED chip B emitting blue chromatic light, a micro LED chip G emitting green chromatic light, and a micro LED chip R emitting red chromatic light. The three micro LED chips are arranged in parallel in a row to form a standard RGB arrangement. In each row or column of pixels, one micro IC 180 is disposed for every N (N is a positive integer greater than 1) pixels. Each micro IC 180 may control N pixels.

For example, as shown in an arrangement in FIG. 7(*b*), a pixel includes a micro LED chip B emitting blue chromatic light, a micro LED chip G emitting green chromatic light, and a micro LED chip R emitting red chromatic light. The three micro LED chips are arranged in parallel in a row to form a standard RGB arrangement. In pixels in each square area, one micro IC 180 is disposed for every N (N is a positive integer greater than 1) pixels. Each micro IC 180 may control N pixels in the area.

To implement the foregoing arrangement, a plurality of second base plates 150 may be prepared in advance. A micro LED chip 130 emitting one type of chromatic light may be detachably disposed on each second base plate 150. Then, in step S105, the micro LED chips 130 emitting different chromatic light may be respectively absorbed from different second base plates 150 and disposed on the first base plate 170. At least one micro IC 180 may be absorbed at a time from a third base plate on which the micro IC 180 is disposed and disposed on the first base plate 170. An attachment layer is also disposed on the third base plate, to detachably dispose the micro IC 180. The foregoing actions of absorbing and disposing the micro LED chip 130 and the micro IC 180 may be repeated for one or more times. One or more chips may be absorbed each time, so that the plurality of micro LED chips and the at least one micro IC 180 finally form a preset pixel arrangement on the first base plate 170.

The first base plate 170 may be made of a material such as glass or a silicon wafer. A first attachment layer 190 is disposed on a surface of the first base plate 170. This can detachably and temporarily fasten the micro LED chip 130 and the micro IC 180 without damaging device structures of the micro LED chip 130 and the micro IC 180. When the micro LED chip and the micro IC 180 are detachably disposed on the first base plate 170, ends of electrodes of the micro LED chip 130 and the micro IC 180 both are in contact with the first attachment layer 190 of the first base plate 170.

Step S106: Coat surfaces of the micro LED chips 130, the micro IC 180, and the first base plate 170 with a transparent packaging layer 210.

The transparent packaging layer 210 may include, for example, an epoxy resin material and a silicone resin material. The transparent packaging layer 210 needs to be cured for a period of time after coating. After curing, relative positions of the micro LED chip 130 and the micro IC 180 can be fastened. In a preferred manner, a coating height of the transparent packaging layer 210 on the surface of the first base plate 170 may be higher than a total height of the micro LED chip 130 and the micro IC 180. In this way, after the transparent packaging layer 210 is cured, the transparent packaging layer 210 may be polished or ground, to form a packaging plane 240 that is parallel to the first base plate 170 and that has good flatness.

Step S107: After the transparent packaging layer 210 is cured, remove the first base plate 170, so that the transparent packaging layer 210 forms a first plane 250 that exposes the electrode 140 of the micro LED chip 130 and the electrode 230 of the micro IC 180.

Because the ends of the electrodes of the micro LED chip 130 and the micro IC 180 are in contact with the first attachment layer 190 of the first base plate 170, after the micro LED chip 130 and the micro IC 180 are separated from the first base plate 170, the electrodes of the micro LED chip 130 and the micro IC 180 are exposed from the first plane 250 of the transparent packaging layer 210.

Step S108: Fabricate an RDL 220 on the first plane 250.

The RDL 220 includes an insulation flat layer and a plurality of RDL lines distributed at the insulation flat layer. The insulation flat layer may be made of silicon or a polymeric material. The RDL line may be made of a conductive material such as copper by using a semiconductor fabrication process technology such as photoetching, vapor deposition, or electroplating. The RDL line may be a single-layer line or a multi-layer line. This is not limited in embodiments of this disclosure.

The RDL line may be divided into two parts according to different directions of the RDL line. A first part of the RDL line is connected to the electrode 140 of the micro LED chip 130 and the electrode 230 of the micro IC 180, so that each micro IC 180 is electrically connected to at least one micro LED chip 130 by using the RDL 220. One end of a second part of the RDL line is connected to the electrode 230 of the micro IC 180, and the other end is exposed on a lower surface 260 of the RDL 220. In this way, if an external drive signal is introduced into the other end of the second part of the RDL line, the drive signal may be transmitted to the micro IC 180.

Step S109: Fabricate a pad 270 and a bump 330 on the lower surface 260 of the RDL 220.

The pad 270 is connected to the other end of the second part of the RDL line. Therefore, the pad 270 can be electrically connected to the micro IC 180 by using the RDL 220. The bump 330 is fabricated on the pad 270, so that the pad 270 is connected to an external device such as a drive backplane.

After this step is completed, a complete micro LED chip packaging module is obtained. The module may be mechanically and electrically connected to another module such as a drive backplane or a display driver integrated circuit (DDIC) or a drive system by using the pad 270, to obtain a complete display.

When the micro LED chip packaging module is driven by an external drive signal, the drive signal first controls the micro IC 180, and then the micro IC 180 controls, based on the drive signal, a working state of at least one micro LED chip 130 connected to the micro IC. This can reduce a quantity of pads between the micro LED chip packaging module and an external device such as a drive backplane. Therefore, for the LED chip packaging module and the drive backplane that have a same size, a size of each pad may be larger, or even far greater than a size of the micro LED chip, to greatly reduce bonding difficulty between the LED chip packaging module and the drive backplane, and improve product yield.

Figure 8:
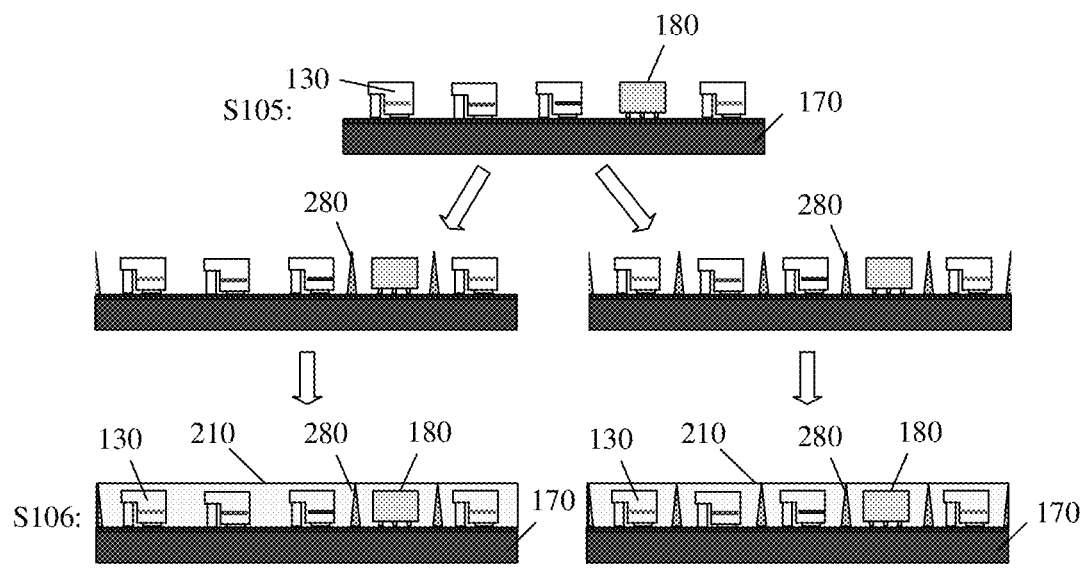
FIG. 8 is a schematic diagram of fabricating a light isolation structure by using an LED chip packaging method according to an embodiment of this disclosure.

In an embodiment, as shown in FIG. 8, after the micro LED chip 130 and the micro IC 180 are transferred to the first base plate 170, and before the surfaces of the micro LED chip 130, the micro IC 180, and the first base plate 170 are coated with the transparent packaging layer 210, that is, between step S105 and step S106, a light isolation structure 280, a black matrix and the like may be fabricated between adjacent pixels, or between the micro LED chips 130, or between the micro LED chip 130 and the micro IC 180, to prevent light ray leakage from a gap between the pixels, reduce crosstalk between the pixels, increase or converge a visual angle of light emitting of the micro LED chip 130, and improve light emitting efficiency, and the like, thereby improving display effect of the micro LED display.

Figure 9:
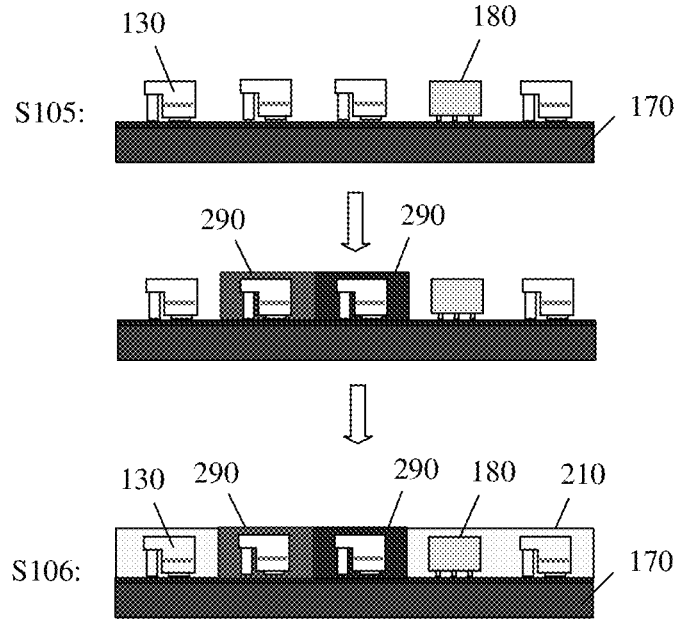
FIG. 9 is a schematic diagram of fabricating a color conversion material by using an LED chip packaging method according to an embodiment of this disclosure.

In an embodiment, as shown in FIG. 9, when one pixel includes a plurality of micro LED chips 130 emitting the same chromatic light, to obtain full-color pixels, after the micro LED chip 130 and the micro IC 180 are transferred to the first base plate 170, and before the surfaces of the micro LED chip 130, the micro IC 180, and the first base plate 170 are coated with the transparent packaging layer 210, that is, between steps S105 and S106, surfaces of some or all of the micro LED chips 130 in the pixels may alternatively be coated with a color conversion material 290, so that different micro LED chips 130 emit different light chromatically by using the color conversion material. For example, when the pixel includes three micro LED chips 130 emitting blue chromatic light, one of the micro LED chips 130 may be coated with a red color conversion material 290, and the other micro LED chip 130 may be coated with a green color conversion material 290. In this way, the three micro LED chips 130 in the pixel finally emit red, green, and blue light, respectively, to form a full-color RBG pixel.

Figures 10, 11:
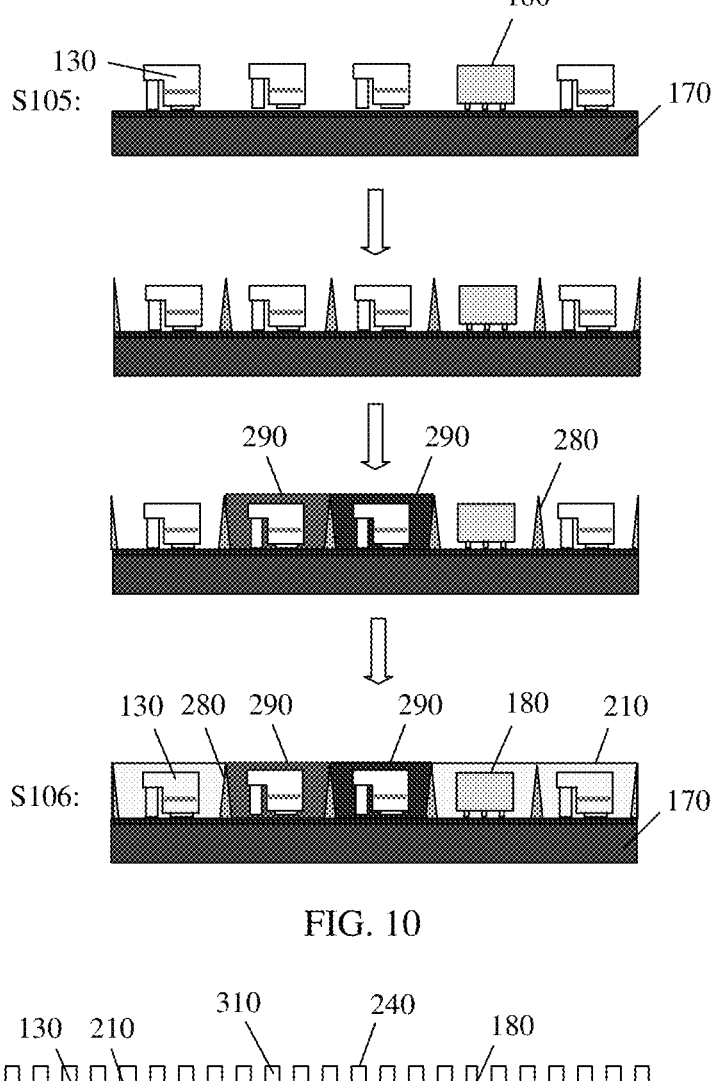
FIG. 10 is a schematic diagram of fabricating a light isolation structure and a color conversion material by using an LED chip packaging method according to an embodiment of this disclosure.
FIG. 11 is a schematic diagram of fabricating a micro-nano structure by using an LED chip packaging method according to an embodiment of this disclosure.

In an embodiment, as shown in FIG. 10, before coating with the color conversion material 290, the light isolation structure 280, the black dot matrix, or the like may be first fabricated between pixels, between micro LED chips 130, or between the micro LED chip 130 and the micro IC 180, to separate color conversion materials 290 of different colors, and finally improve display effect of the LED chip packaging module and a display including the LED chip packaging module.

In an embodiment, as shown in FIG. 11, after the surfaces of the micro LED chip 130, the micro IC 180, and the first base plate 170 are coated with the transparent packaging layer 210 (that is, after step S106), a micro-nano structure 310 may be further fabricated on the packaging plane 240 of the transparent packaging layer 210, to improve light emitting efficiency of the micro LED display, improve a light emitting field pattern, or improve other optical features. For example, the micro-nano structure 310 may be, for example, a densely arranged stripe-shaped protrusion structure.

An embodiment of this disclosure further provides an LED chip packaging module. The LED chip packaging module may be obtained by using the foregoing method described in the embodiments of this disclosure, or may be obtained by using another fabrication method.

Figure 12:
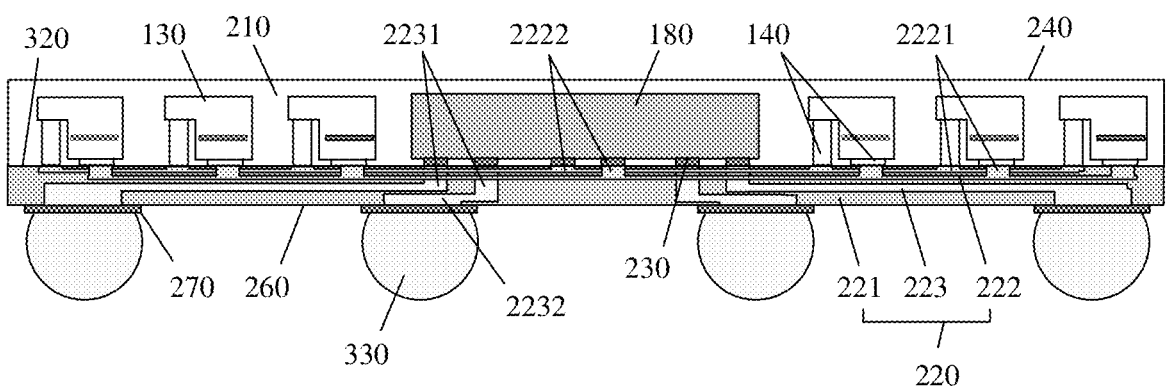
FIG. 12 is a schematic diagram of a structure of an LED chip packaging module according to an embodiment of this disclosure.

FIG. 12 is a schematic diagram of a structure of an LED chip packaging module according to an embodiment of this disclosure. As shown in FIG. 12, the LED chip packaging module includes an RDL 220, a plurality of micro LED chips 130, at least one micro IC 180, and a transparent packaging layer 210.

The plurality of micro LED chips 130 and the at least one micro IC 180 are distributed on an upper surface 320 of the RDL 220. Each micro LED chip 130 is provided with at least one electrode 140 that faces the upper surface 320 of the RDL 220 and that is connected to the RDL 220. Each micro IC 180 is provided with at least one electrode 230 that faces the upper surface 320 of the RDL 220 and that is connected to the RDL 220. Each micro IC 180 is electrically connected to at least one micro LED chip 130 by using the RDL 220. The upper surface 320 of the RDL 220 is coated with the transparent packaging layer 210. A thickness of the transparent packaging layer 210 in a direction perpendicular to the upper surface 320 of the RDL 220 is greater than or equal to a thickness of the micro LED chip 130 and the micro IC 180 in the direction perpendicular to the upper surface 320 of the RDL 220. Therefore, the transparent packaging layer 210 can cover the micro LED chip 130 and the micro IC 180, and the transparent packaging layer 210 may further form a packaging plane 240 parallel to the RDL 220 through polishing. At least one pad 270 is further disposed on a lower surface 260 of the RDL 220. Each pad 270 is electrically connected to the at least one micro IC 180 by using the RDL 220. A bump 330 may be further fabricated for each pad 270, to solder the pad 270 of the RDL 220 to a pad on a drive backplane of a display, so that the LED chip packaging module is mechanically and electrically connected to the drive backplane.

In this embodiment of this disclosure, the micro IC 180 may be disposed in a plurality of manners relative to the RDL 220. For example:

(1) All of the micro ICs 180 may be disposed on the upper surface 320 of the RDL 220, as shown in FIG. 12.

(2) All of the micro ICs 180 may be disposed on the lower surface 260 of the RDL 220. In this configuration manner, only the micro LED chip 130 needs to be disposed on the upper surface 320 of the RDL 220, and no space needs to be reserved for the micro IC 180. This improves pixel density of the LED chip packaging module and improves display effect. In addition, the micro IC 180 may have larger disposing space and a more flexible layout manner on the lower surface 260 of the RDL 220. Therefore, the micro IC 180 with a larger size and stronger performance may be disposed, thereby improving performance of the LED chip packaging module.

(3) Some of the micro ICs 180 are disposed on the upper surface 320 of the RDL 220, and the other micro ICs 180 are disposed on the lower surface 260 of the RDL 220. In this configuration, the micro IC 180 on the upper surface 320 and the micro IC 180 on the lower surface 260 may each control some of the micro LED chips 130. The micro IC 180 on the upper surface 320 and the micro IC 180 on the lower surface 260 may control the same or different micro LED chips 130. In this configuration, the upper surface 320 of the RDL 220 only needs to reserve space for some of the micro ICs 180. This improves pixel density of the LED chip packaging module and improves display effect. In an implementation, a small-sized micro IC 180 may be disposed on the upper surface 320 of the RDL 220. A large-sized micro IC 180 may be disposed on the lower surface 260 of the RDL 220. This maximizes surface space utilization of the RDL 220.

It should be noted that when the micro IC 180 is disposed on the lower surface 260 of the RDL 220, a height of the micro IC 180 in a direction perpendicular to the lower surface 260 should be less than a sum of heights of the pad 270 and the bump 330. In this way, the micro IC 180 does not affect soldering of the LED chip packaging module to the drive backplane of the display.

In an embodiment, as shown in FIG. 12, the RDL 220 includes an insulation flat layer 221 and a plurality of RDL lines distributed at the insulation flat layer 221. For ease of description, the RDL lines are divided into a first RDL line 222 and a second RDL line 223 based on different directions of the RDL lines and devices connected to the RDL lines. Two ends of the first RDL line 222 are respectively referred to as a first end 2221 and a second end 2222. Two ends of the second RDL line 223 are respectively referred to as a third end 2231 and a fourth end 2232. The first end 2221 and the second end 2222 of the first RDL are located on the upper surface 320 of the RDL 220. The third end 2231 of the second RDL line 223 is located on the upper surface 320 of the RDL 220. The fourth end 2232 of the second RDL line 223 is located on the lower surface 260 of the RDL 220. A pad 270 may be disposed at the fourth end 2232 of the second RDL line 223, to be electrically connected to another device. The first end 2221 of the first RDL line 222 is configured to connect to the electrode 140 of the micro LED chip 130. Each first RDL line 222 may have at least one first end 2221, configured to connect to an electrode 140 of at least one micro LED chip 130. The second end 2222 of the first RDL line 222 is configured to connect to the electrode 230 of the micro IC 180. An electrode 230 of each micro IC 180 may be connected to a second end 2222 of at least one first RDL line 222. The third end 2231 of the second RDL line 223 is configured to connect to the electrode 230 of the micro IC 180. A third end 2231 of each second RDL line 223 may be connected to an electrode 230 of at least one micro IC 180. The second end 2222 of the first RDL line 222 and the third end 2231 of the second RDL line 223 are connected to different electrodes 230. A bump 330 is disposed on the pad 270 of the fourth end 2232 of the second RDL line 223, to connect to an external device and receive an external drive signal.

When the micro LED chip packaging module provided in this embodiment of this disclosure is driven by an external drive signal, the drive signal first controls the micro IC 180, and then the micro IC 180 controls, based on the drive signal, a working state of at least one micro LED chip 130 connected to the micro IC. This can reduce a quantity of I/O pads between the micro LED chip packaging module and an external device such as a drive backplane. Therefore, for a LED chip packaging module and drive backplane that have the same size, a size of each pad may be larger, or even far greater than a size of the micro LED chip, to greatly reduce bonding difficulty between the LED chip packaging module and the drive backplane, and improve product yield.

Figure 13:
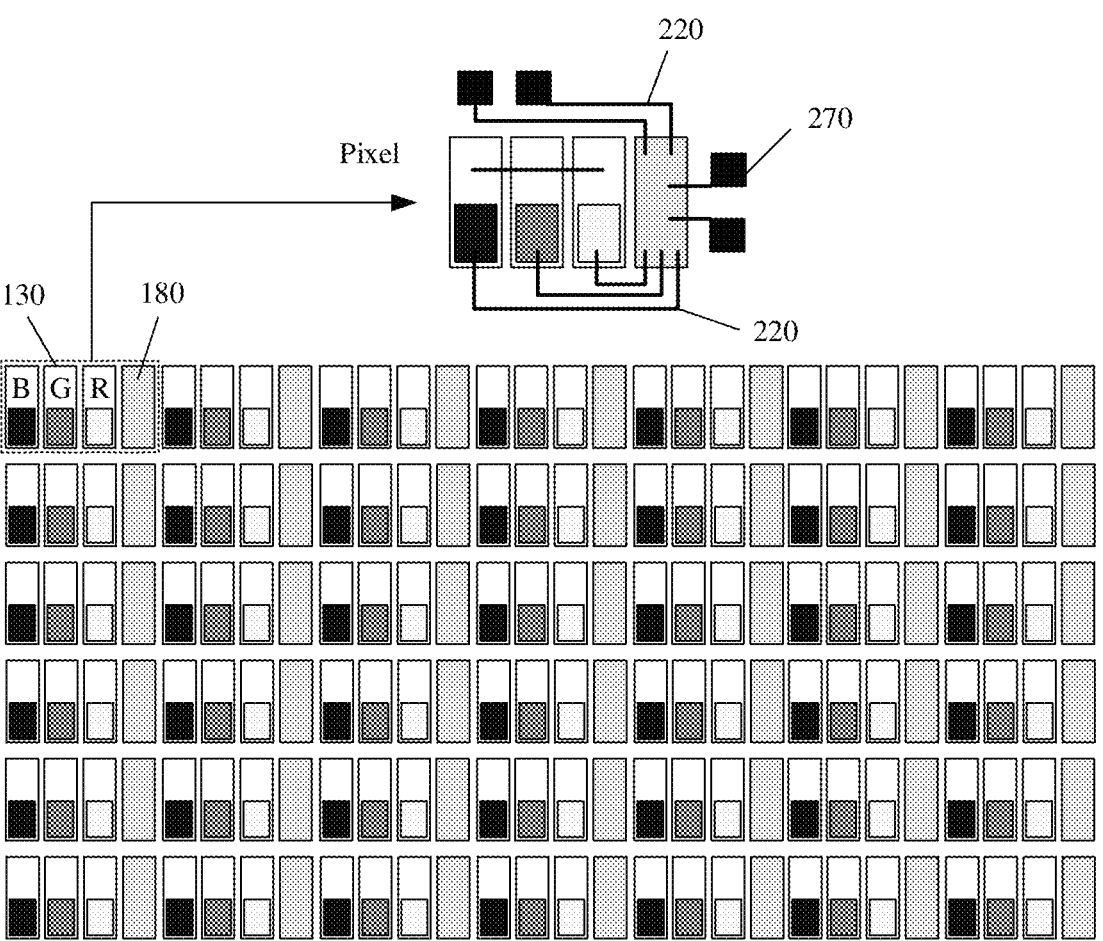
FIG. 13 is a schematic diagram of an arrangement of a micro LED chip and a micro IC in an LED chip packaging module according to an embodiment of this disclosure.

In an embodiment, as shown in FIG. 13, micro LED chips 130 in the LED chip packaging module may form a plurality of pixels in a specific arrangement manner. Each pixel includes at least one micro LED chip 130. To form a full-color pixel arrangement, each pixel may include three micro LED chips 130, for example, a micro LED chip B emitting blue chromatic light, a micro LED chip G emitting green chromatic light, and a micro LED chip R emitting red chromatic light. The three chips may be located in the same row to form a standard RGB arrangement. In addition, each pixel may further include a micro IC 180. The micro IC 180 is electrically connected to the three micro LED chips 130 in the pixel by using the RDL 220, and is configured to control working states of the three micro LED chips 130, for example, a lighting time point and intensity. Therefore, the pixel can display various colors. In this case, each micro IC 180 is configured to control a working state of only one pixel.

Figure 14:
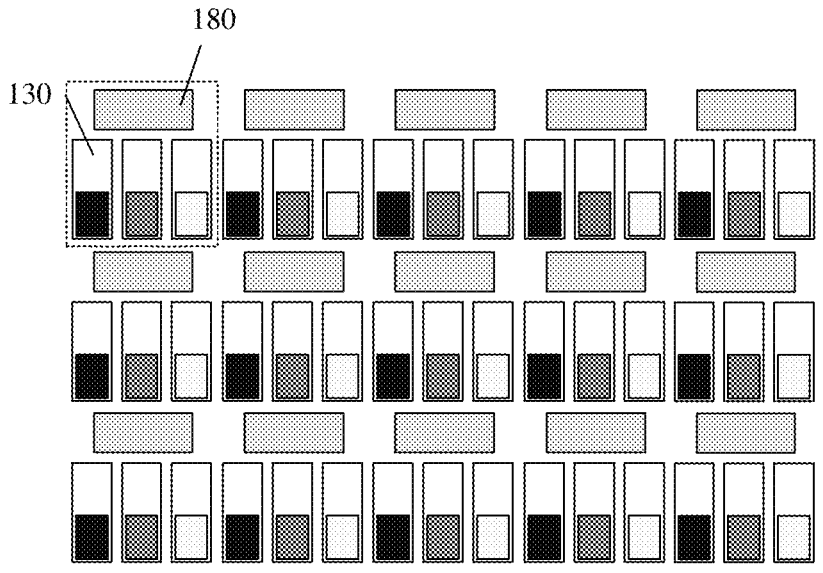
FIG. 14 is a schematic diagram of another arrangement of a micro LED chip and a micro IC in an LED chip packaging module according to an embodiment of this disclosure.

In an embodiment, as shown in FIG. 14, each pixel may include three micro LED chips 130 and one micro IC 180. The three micro LED chips 130 may be located in the same row to form a standard RGB arrangement. The micro IC 180 may be separately disposed in another row.

It may be understood that, in addition to the arrangement manner shown in this embodiment of this disclosure, the micro LED chip 130 may have another arrangement, for example, a pentile arrangement or a RGB-Delta arrangement. This is not limited in embodiments of this disclosure.

Figure 15:
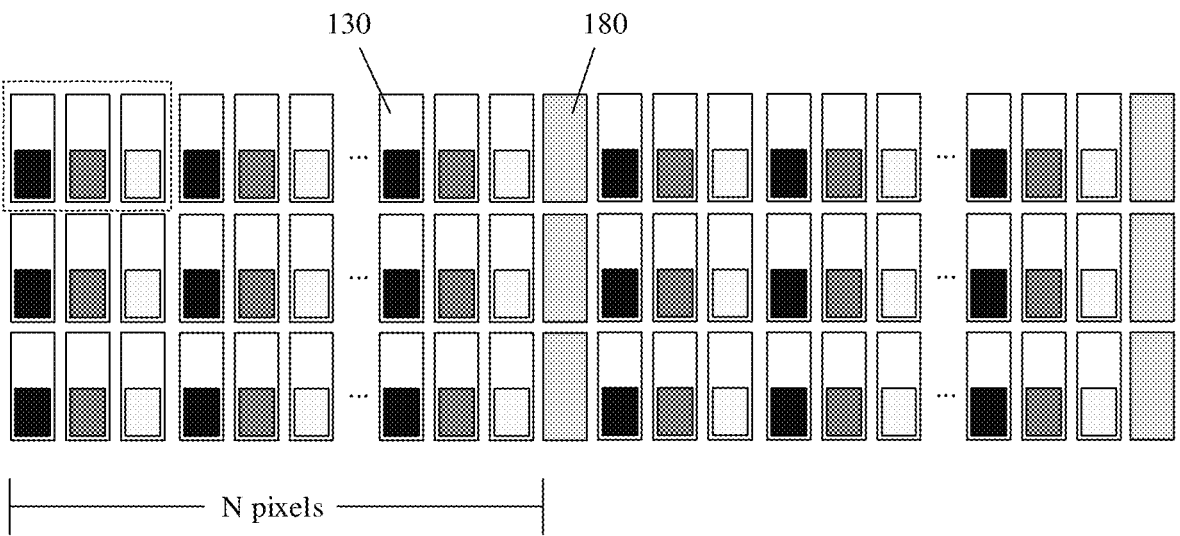
FIG. 15 is a schematic diagram of still another arrangement of a micro LED chip and a micro IC in an LED chip packaging module according to an embodiment of this disclosure.

In an embodiment, as shown in FIG. 15, each pixel may include three micro LED chips 130, to form a standard RGB arrangement. In each row or column of pixels, one micro IC 180 may be disposed for every N (N is a positive integer greater than 1) pixels. Each micro IC 180 may be electrically connected to micro LED chips 130 in N pixels adjacent to a row or column in which the micro IC 180 is located by using the RDL, to control working states of the micro LED chips 130 in the N pixels adjacent to the micro IC 180.

It may be understood that, when each micro IC 180 is configured to control color rendering of the N pixels, the micro IC 180 may alternatively configure pixels in another distribution manner. Each micro IC 180 may be electrically connected to a plurality of pixels adjacent to the micro IC 180 by using the RDL, to control color rendering of these pixels. This is not limited in embodiments of this disclosure.

Figure 16:
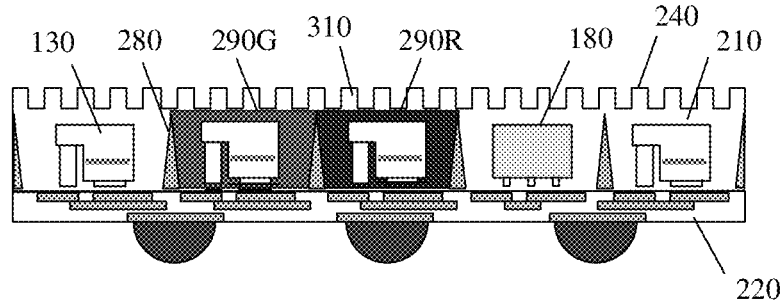
FIG. 16 is a schematic diagram of another structure of an LED chip packaging module according to an embodiment of this disclosure.

In an embodiment, as shown in FIG. 16, some or all of the micro LED chips 130 in each pixel may be micro LED chips emitting the same chromatic light. In this case, surfaces of some or all of the micro LED chips 130 may be coated with a color conversion material. The color conversion material converts the chromatic light emitted by the micro LED chip 130 into another color. For example, when one pixel includes three micro LED chips 130 emitting blue chromatic light, to obtain a full-color pixel, a surface of one of the micro LED chips 130 may be coated with a red color conversion material 290R, to convert the blue light emitted by the micro LED chip 130 into red light. A surface of another micro LED chip 130 may be coated with a green color conversion material 290G, to convert the blue light emitted by the micro LED chip 130 into green light.

In an embodiment, as shown in FIG. 16, a light isolation structure 280 may be further disposed between the micro LED chip 130 and the micro IC 180. The light isolation structure 280 may alternatively be disposed between two adjacent micro LED chips 130. One end of the light isolation structure 280 is connected to the RDL 220, and the other end extends in a direction away from the RDL 220. The light isolation structure 280 improves light emitting efficiency of the micro LED chip 130, reduces crosstalk between pixels, increases or converges a light emitting visual angle of the micro LED chip 130, separates color conversion materials 290 of different colors, and improves display effect of the LED chip packaging module and a display including the LED chip packaging module.

It may be understood that, to improve display effect of the LED chip packaging module and a display including the LED chip packaging module, the LED chip packaging module may include a structure such as a black matrix in addition to the light isolation structure 280. This is not limited in embodiments of this disclosure.

In some embodiments, the packaging plane 240 of the transparent packaging layer 210 has a micro-nano structure 310. The micro-nano structure 310 may be, for example, a densely arranged stripe-shaped protrusion structure. The micro-nano structure 310 improves light emitting efficiency of the micro LED display, improves a light emitting field pattern, and improves other optical features.

In an embodiment, each pixel of the LED chip packaging module may further include at least one secondary micro LED chip. When detecting the LED chip packaging module and finding that a primary micro LED chip in a pixel fails, the micro IC may drive the secondary micro LED chip of the pixel to take over the job of the failed micro LED chip. In this way, the pixel can still display colors normally, thereby maintaining display integrity of the LED chip packaging module and improving a yield of the LED chip packaging module.

Figure 17:
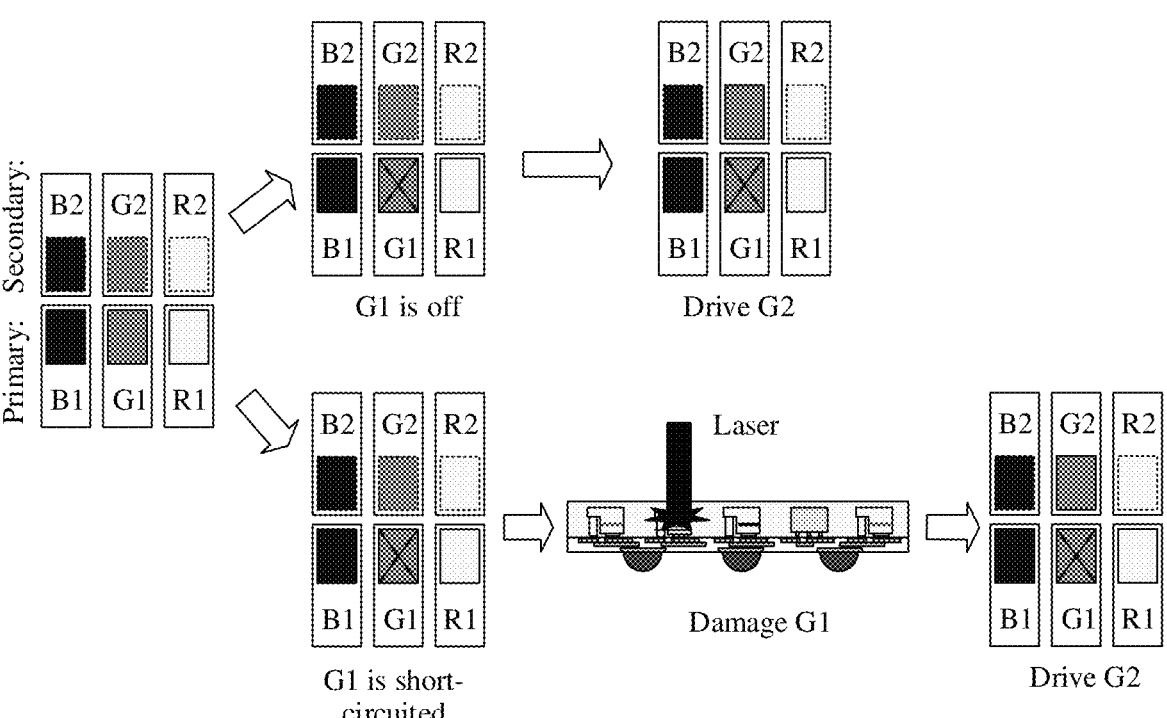
FIG. 17 is a schematic diagram of an arrangement manner of primary and secondary micro LED chips in an LED chip packaging module according to an embodiment of this disclosure.

In an embodiment, as shown in FIG. 17, each primary micro LED chip in a pixel may correspond to a secondary micro LED chip whose light emitting color is the same as a light emitting color of the primary micro LED chip. Therefore, one full-color pixel may include six micro LED chips, that is, two micro LED chips R1 and R2 that emit red chromatic light, two micro LED chips G1 and G2 that emit green chromatic light, and two micro LED chips B1 and B2 that emit blue chromatic light. When all primary micro LED chips are normal, the secondary micro LED chips do not work. The micro IC drives only the primary chips to work. When any primary micro LED chip fails, the micro IC drives a secondary micro LED chip of the same color to take over the job of the failed micro LED chip.

For example, when the primary micro LED chip G1 emitting the green chromatic light fails, but is in an off state or a leakage current is lower than a threshold (the threshold may be, for example, 1% of a normal drive current), the micro IC may directly drive the secondary micro LED chip G2 emitting green chromatic light. When the primary micro LED chip G1 emitting green chromatic light fails, but is in an on state or a leakage current is higher than the threshold, a laser may first break the failed micro LED chip G1 emitting the green chromatic light or the corresponding fuse line, so that the failed chip is in an off state, and then the secondary micro LED chip G2 emitting the green chromatic light is driven.

Figure 18:
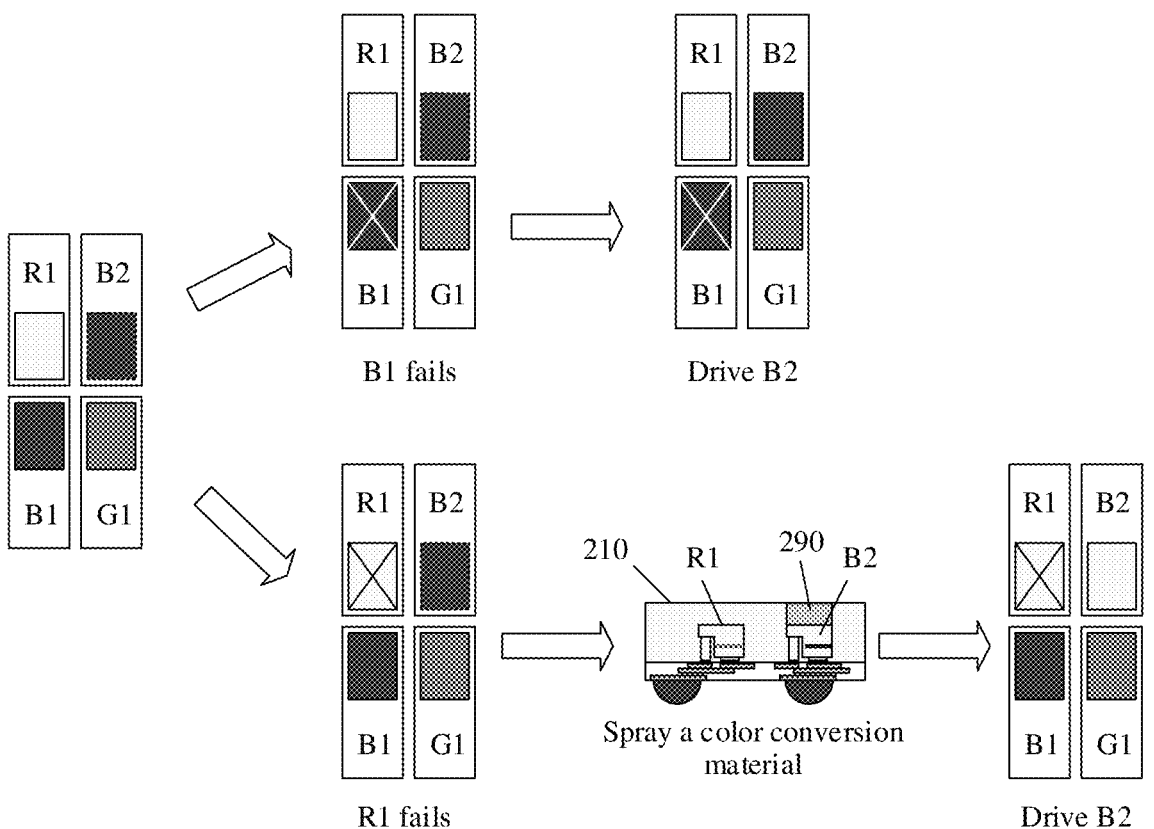
FIG. 18 is a schematic diagram of another arrangement of primary and secondary micro LED chips in an LED chip packaging module according to an embodiment of this disclosure.

In an embodiment, as shown in FIG. 18, because a failure probability of two micro LED chips in a pixel is far lower than a failure probability of one micro LED chip, each pixel may also include only one secondary micro LED chip, to improve size utilization of the LED chip packaging module, improve pixel density, and reduce costs.

For example, one full-color pixel may include four micro LED chips, that is, a primary micro LED chip R1 emitting red chromatic light, a primary micro LED chip G1 emitting green chromatic light, a primary micro LED chip B1 emitting blue chromatic light, and a secondary micro LED chip B2. It is assumed that the secondary micro LED chip emits blue chromatic light. When the primary micro LED chip B1 emitting blue chromatic light fails, the micro IC can directly drive the secondary micro LED chip B2. When the primary micro LED chip R1 or G1 that emits red chromatic light or green chromatic light fails, the transparent packaging layer 210 around the secondary micro LED chip B2 may be removed first by using a laser. Then, color conversion material 290 whose color is the same as that of the failed micro LED chip is sprayed on. In this way, the secondary micro LED chip B2 can emit chromatic light whose color is the same as that of the failed micro LED chip after being driven by the micro IC.

In some other embodiments, one secondary micro LED chip may be further configured to replace a failed micro LED chip in more than one pixel, to reduce a quantity of secondary micro LED chips, improve size utilization of the LED chip packaging module, improve pixel density, and reduce costs.

Figures 19, 20:
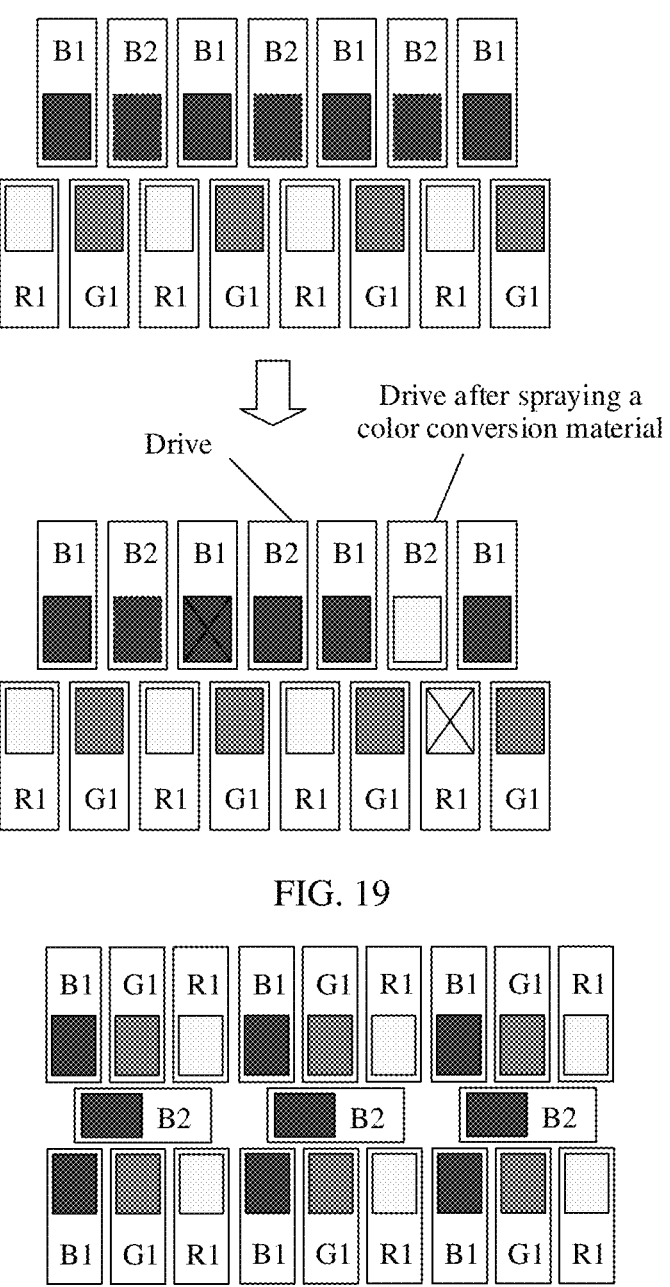
FIG. 19 is a schematic diagram of still another arrangement of primary and secondary micro LED chips in an LED chip packaging module according to an embodiment of this disclosure.
FIG. 20 is a schematic diagram of yet another arrangement of primary and secondary micro LED chips in an LED chip packaging module according to an embodiment of this disclosure.

For example, as shown in FIG. 19, one full-color pixel may include three micro LED chips, that is, a micro LED chip R1 emitting red chromatic light, a micro LED chip G1 emitting green chromatic light, and a micro LED chip B1 emitting blue chromatic light. The three micro LED chips may be arranged in a triangle. The micro LED chip R1 emitting red chromatic light and the micro LED chip G1 emitting green chromatic light are located in a same row and disposed in parallel. The micro LED chip B1 emitting blue chromatic light is located above the other two chips. The secondary micro LED chip may be the micro LED chip B2 emitting blue chromatic light, and is disposed between micro LED chips B1 that emit blue chromatic light of two adjacent pixels, to form an arrangement in which the primary micro LED chip and the secondary micro LED chip are alternately disposed in the same row. In this arrangement, when a micro LED chip B1 that is of a pixel and that emits blue chromatic light fails, the micro IC may directly drive a secondary micro LED chip B2 adjacent to the micro IC. When a micro LED chip R1 or G1 that is of a pixel and that emits red chromatic light or green chromatic light fails, the transparent packaging layer around a secondary micro LED chip B2 closest to the failed chip may be removed first by using a laser. Then, the color conversion material whose color is the same as that of the failed micro LED chip is sprayed. In this way, the secondary micro LED chip B2 can emit chromatic light whose color is the same thereon as that of the failed micro LED chip after being driven by the micro IC.

For example, as shown in FIG. 20, three micro LED chips in a full-color pixel may form a standard RGB arrangement. Then, every two adjacent pixels in a same row or a same column are grouped into a group. A secondary micro LED chip B2 is disposed between the two pixels, so that the secondary micro LED chip B2 can be used to replace a failed micro LED chip in the group of pixels.

It may be understood that the implementations shown in FIG. 17 to FIG. 20 are merely used as examples to describe technical concepts of embodiments of this disclosure, and do not constitute a specific limitation on embodiments of this disclosure. In addition to the foregoing shown implementations, a person skilled in the art may further use other implementations under inspiration of the technical concepts. These implementations do not go beyond the protection scope of embodiments of this disclosure.

It should also be additionally noted that currently, there may be two light emitting directions of the micro LED chip. One is light emitting from a back side. In other words, a light ray emitted by the micro LED chip to an external environment does not pass through the RDL. The other is light emitting from a front side. In other words, a light ray emitted by the micro LED chip to an external environment needs to pass through the RDL. When the micro LED chip emits light from the back side, the insulation flat layer in the RDL may be made of a non-transparent material, and has an opaque feature. In this case, the insulation flat layer can absorb or reflect a light ray emitted by the micro LED chip, to improve luminosity. When the micro LED chip emits light from the front side, the insulation flat layer in the RDL may be made of a non-transparent material, and has a high penetration or a transparent feature, so that a light ray emitted by the micro LED chip can efficiently pass through the RDL, to improve luminosity.

Figure 21:
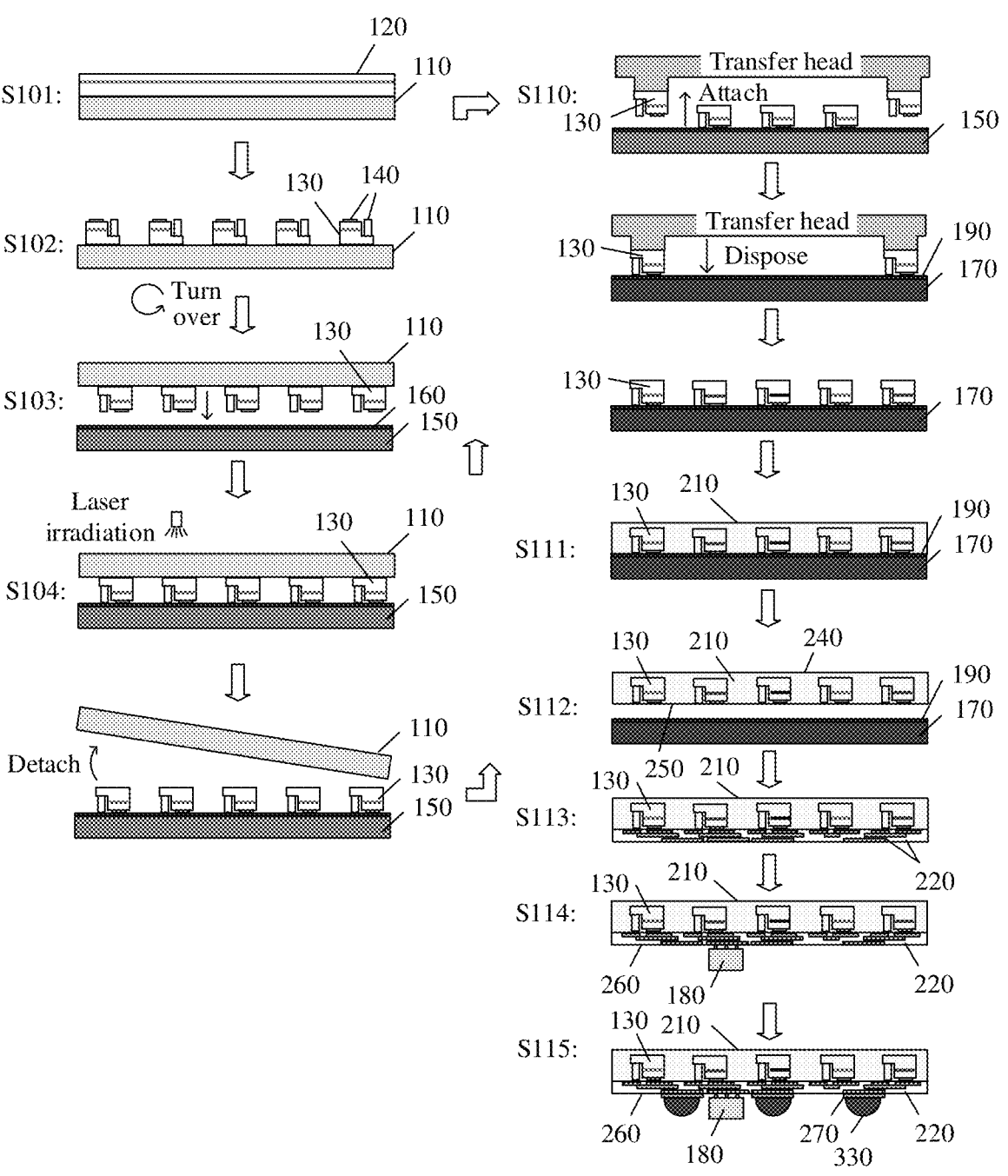
FIG. 21 is a flowchart of another LED chip packaging method according to an embodiment of this disclosure.

An embodiment of this disclosure further provides another LED chip packaging method. As shown in FIG. 21, the method may include the following steps.

Step S101 to step S104 are the same as step S101 to step S104 shown in FIG. 4, and details are not described herein again.

Step S110: Detachably dispose the micro LED chip 130 on a first base plate 170. The electrode 140 of the micro LED chip 130 is disposed to face the first base plate 170.

A difference between step S110 and step S105 lies in that: In step S110, the micro IC 180 is not placed on the first base plate 107.

In an embodiment, a plurality of micro LED chips 130 may be disposed on the first base plate 170 to form a plurality of pixels. Each of the pixels includes at least one of the micro LED chips 130.

For example, as shown in an arrangement in FIG. 22(a), a pixel includes a micro LED chip B emitting blue chromatic light, a micro LED chip G emitting green chromatic light, and a micro LED chip R emitting red chromatic light. The three micro LED chips are arranged in parallel in a row to form a standard RGB arrangement.

For example, as shown in an arrangement in FIG. 22(b), a pixel may include four micro LED chips, for example, two micro LED chips B emitting blue chromatic light, one micro LED chip R emitting red chromatic light, and one micro LED chip G emitting green chromatic light. The four micro LED chips are arranged in a rectangular manner. A position of each micro LED chip may be considered as a corner of a rectangle. The two micro LED chips B emitting blue chromatic light are disposed in a diagonal manner.

A first attachment layer 190 is disposed on a surface of the first base plate 170. This can detachably and temporarily fasten the micro LED chip 130 without damaging a device structure of the micro LED chip 130. When the micro LED chip is detachably disposed on the first base plate 170, an end of an electrode of the micro LED chip 130 is in contact with the first attachment layer 190 of the first base plate 170.

Step S111: Coat surfaces of the micro LED chip 130 and the first base plate 170 with a transparent packaging layer 210.

The transparent packaging layer 210 may include, for example, an epoxy resin material and a silicone resin material. The transparent packaging layer 210 needs to be cured for a period of time after coating. After curing, relative positions between the micro LED chips 130 can be fastened. In a preferred manner, a coating height of the transparent packaging layer 210 on the surface of the first base plate 170 may be higher than a height of the micro LED chip 130. In this way, after the transparent packaging layer 210 is cured, the transparent packaging layer 210 may be polished or ground, to form a packaging plane 240 that is parallel to the first base plate 170 and that has good flatness.

Step S112: After the transparent packaging layer 210 is cured, remove the first base plate 170, so that the transparent packaging layer 210 forms a first plane 250 that exposes the electrode of the micro LED chip 130.

Because the end of the electrode of the micro LED chip 130 is in contact with the first attachment layer 190 of the first base plate 170, after the micro LED chip 130 is separated from the first base plate 170, the electrode of the micro LED chip 130 is exposed from the first plane 250 of the transparent packaging layer 210.

Step S113: Fabricate an RDL 220 on the first plane 250.

The RDL 220 includes an insulation flat layer and a plurality of RDL lines distributed at the insulation flat layer. The insulation flat layer may be made of silicon or a polymeric material. The RDL line may be made of a conductive material such as copper by using a semiconductor fabrication process technology such as photoetching, vapor deposition, or electroplating. The RDL line may be a single-layer line or a multi-layer line. This is not limited in embodiments of this disclosure.

The RDL line may be divided into two parts according to different directions of the RDL line. One end of a first part of the RDL line is connected to the electrode of the micro LED chip 130. The other end is exposed on a lower surface 260 of the RDL 220. Both ends of a second part of the RDL line are exposed on the lower surface 260 of the RDL 220.

Step S114: Mount at least one micro IC 180 on the lower surface 260 of the RDL.

Some of electrodes of the micro ICs 180 are connected to the first part of the RDL line, to implement an electrical connection between the micro IC 180 and the at least one micro LED chip 130 by using the RDL 221. Some of the micro ICs 180 are connected to one end of the second part of the RDL line. In this case, if an external drive signal is introduced to the other end of the second part of the RDL line, the drive signal may be transmitted to the micro IC 180.

Step S115: Fabricate a pad 270 and a bump 330 on the lower surface 260 of the RDL 220.

The pad 270 is connected to the other end of the second part of the RDL line. Therefore, the pad 270 can be electrically connected to the micro IC 180 by using the RDL. The bump 330 is fabricated on the pad 270, so that the pad 270 is connected to an external device such as a drive backplane.

After this step is completed, a complete micro LED chip packaging module is obtained. The module may be mechanically and electrically connected to another module such as a drive backplane or a display driver integrated circuit (DDIC) or a drive system by using the bump 330, to obtain a complete display.

When the micro LED chip packaging module is driven by an external drive signal, the drive signal first controls the micro IC 180, and then the micro IC 180 controls, based on the drive signal, a working state of at least one micro LED chip 130 connected to the micro IC. This can reduce a quantity of I/O pads between the micro LED chip packaging module and an external device such as a drive backplane. Therefore, for the LED chip packaging module and the drive backplane that have the same size, a size of each pad may be larger, or even far greater than a size of the micro LED chip, to greatly reduce bonding difficulty between the LED chip packaging module and the drive backplane, and improve product yield.

A structure shown in FIG. 8 to FIG. 11 may also be added to the micro LED chip packaging module fabricated according to the method in FIG. 21, to implement a corresponding feature. Details are redundant and therefore not further described herein.

An embodiment of this disclosure further provides an LED chip packaging module. The LED chip packaging module may be obtained by using the method, for example, shown in FIG. 21, in embodiments of this disclosure, or may be obtained by using another fabrication method.

Figure 24:
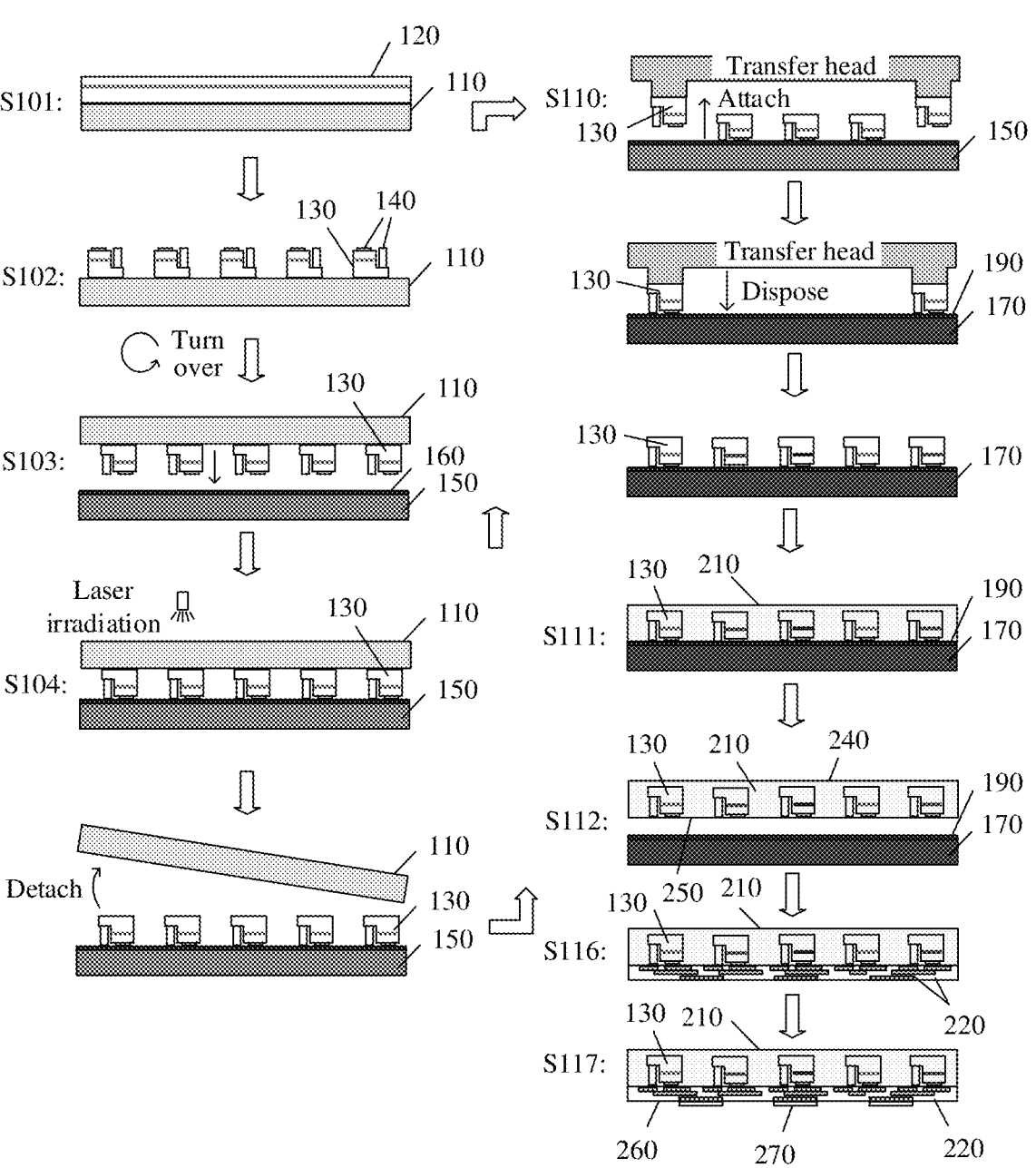
FIG. 24 is a flowchart of still another LED chip packaging method according to an embodiment of this disclosure.

FIG. 23 is a schematic diagram of still another structure of an LED chip packaging module according to an embodiment of this disclosure. As shown in FIG. 24, the LED chip packaging module includes an RDL 220, a plurality of micro LED chips 130, at least one micro IC 180, and a transparent packaging layer 210.

The plurality of micro LED chips 130 are distributed on an upper surface 320 of the RDL 220. Each micro LED chip 130 is provided with at least one electrode 140 that faces the upper surface 320 of the RDL 220 and that is connected to the RDL 220. The at least one micro IC 180 is distributed on a lower surface 260 of the RDL 220. Each micro IC 180 is provided with at least one electrode 230 that faces the lower surface 260 of the RDL 220 and that is connected to the RDL 220. Each micro IC 180 is electrically connected to at least one micro LED chip 130 by using the RDL 220. The upper surface 320 of the RDL 220 is coated with the transparent packaging layer 210. A thickness of the transparent packaging layer 210 in a direction perpendicular to the upper surface 320 of the RDL 220 is greater than or equal to a thickness of the micro LED chip 130 in the direction perpendicular to the upper surface 320 of the RDL 220. Therefore, the transparent packaging layer 210 can cover the micro LED chip 130, and the transparent packaging layer 210 may further form a packaging plane 240 parallel to the RDL 220 through polishing. At least one pad 270 is further disposed on a lower surface 260 of the RDL 220. Each pad 270 is electrically connected to the at least one micro IC 180 by using the RDL 220. A bump 330 may be further fabricated for each pad 270, to solder the pad 270 of the RDL 220 to a pad on a drive backplane of a display, so that the LED chip packaging module is mechanically and electrically connected to the drive backplane.

Further, as shown in FIG. 23, the RDL 221 includes an insulation flat layer 221 and a plurality of RDL lines distributed at the insulation flat layer 221. For ease of description, the RDL lines are divided into a first RDL line 222 and a second RDL line 223 based on different directions of the RDL lines and devices connected to the RDL lines. Two ends of the first RDL line 222 are respectively referred to as a first end 2221 and a second end 2222. Two ends of the second RDL line 223 are respectively referred to as a third end 2231 and a fourth end 2232. The first end 2221 of the first RDL line 222 is located on the upper surface 320 of the RDL 220. The second end 2222 of the first RDL line 222 is located on the lower surface 260 of the RDL 220. The third end 2231 and the fourth end 2232 of the second RDL line 223 are located on the lower surface 260 of the RDL 220. A pad may be disposed at the fourth end 2232 of the second RDL line 223, to be electrically connected to another device. The first end 2221 of the first RDL line 222 is configured to connect to the electrode 140 of the micro LED chip 130. Each first RDL line 222 may have at least one first end 2221, configured to connect to an electrode 140 of at least one micro LED chip 130. The second end 2222 of the first RDL line 222 is configured to connect to the electrode 230 of the micro IC 180. An electrode 230 of each micro IC 180 may be connected to a second end 2222 of at least one first RDL line 222. The third end 2231 of the second RDL line 223 is configured to connect to the electrode 230 of the micro IC 180. A third end 2231 of each second RDL line 223 may be connected to an electrode 230 of at least one micro IC 180. The second end 2222 of the first RDL line 222 and the third end 2231 of the second RDL line 223 are connected to different electrodes 230. A bump 330 is disposed on the pad 270 of the fourth end 2232 of the second RDL line 223, to connect to an external device and receive an external drive signal.

When the micro LED chip packaging module provided in this embodiment of this disclosure is driven by an external drive signal, the drive signal first controls the micro IC 180, and then the micro IC 180 controls, based on the drive signal, a working state of at least one micro LED chip 130 connected to the micro IC. This can reduce a quantity of I/O pads between the micro LED chip packaging module and an external device such as a drive backplane. Therefore, for the LED chip packaging module and the drive backplane that have the same size, a size of each pad may be larger, or even far greater than a size of the micro LED chip, to greatly reduce bonding difficulty between the LED chip packaging module and the drive backplane, and improve product yield.

In this embodiment of this disclosure, the micro LED chips 130 may form a standard RGB arrangement, a pentile arrangement, an RGB-Delta arrangement, an arrangement shown in FIG. 17 to FIG. 20, or another arrangement. Details are not described herein again.

An embodiment of this disclosure further provides another LED chip packaging method. As shown in FIG. 24, the method includes step S101 to step S104 and step S110 to step S112 that are the same as those in FIG. 21.

Step S116: Fabricate an RDL 220 on the first plane 250.

The RDL 220 includes an insulation flat layer and a plurality of RDL lines distributed at the insulation flat layer. One end of each RDL line is connected to an electrode 140 of at least one micro LED chip. The other end is exposed on the lower surface 260.

Step S117: Fabricate, on the lower surface 260, a pad 270 connected to the RDL line.

Each pad 270 may be connected to one or more RDL lines. When each pad is connected to a plurality of RDL lines, the pad 270 may be in an irregular shape based on different exposed positions that is of the RDL lines connected to the pad 270 and that is on the lower surface 260.

After this step is completed, a complete micro LED chip packaging module is obtained. The module may be mechanically and electrically connected to another module such as a drive backplane or a display driver integrated circuit (DDIC) or a drive system by using the pad 270, to obtain a complete display.

When the micro LED chip packaging module is driven by an external drive signal, the drive signal is directly sent to at least one micro LED chip 130 by using a pad 270 and the RDL 220, so that one drive signal controls one or more micro LED chips 130. This can reduce a quantity of pads between the packaging module and an external device such as a drive backplane. Therefore, for the LED chip packaging module and the drive backplane that have the same size, a size of each pad may be larger, or even far greater than a size of the micro LED chip, to greatly reduce bonding difficulty between the LED chip packaging module and the drive backplane, and improve product yield.

An embodiment of this disclosure further provides an LED chip packaging module. The LED chip packaging module may be obtained by using the method, for example, shown in FIG. 24, in embodiments of this disclosure, or may be obtained by using another fabrication method.

Figure 25:
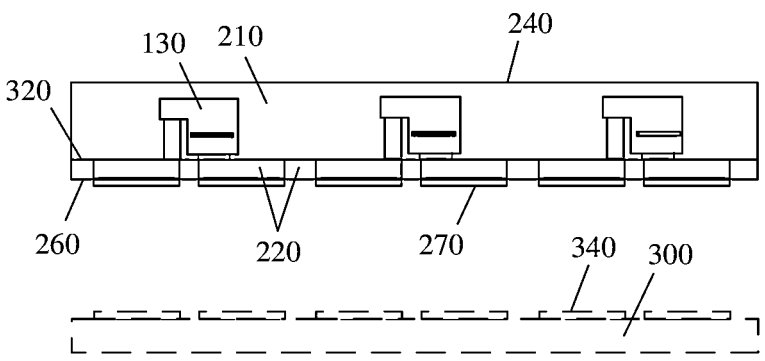
FIG. 25 is a schematic diagram of yet another structure of an LED chip packaging module according to an embodiment of this disclosure.

FIG. 25 is a schematic diagram of yet another structure of an LED chip packaging module according to an embodiment of this disclosure. As shown in FIG. 25, the LED chip packaging module includes an RDL 220, a plurality of micro LED chips 130 and a transparent packaging layer 210.

The plurality of micro LED chips 130 are distributed on an upper surface 320 of the RDL 220. Each micro LED chip 130 is provided with at least one electrode 140 that faces the upper surface 320 of the RDL 220 and that is connected to the RDL 220. The upper surface 320 of the RDL 220 is coated with the transparent packaging layer 210. A thickness of the transparent packaging layer 210 in a direction perpendicular to the upper surface 320 of the RDL 220 is greater than or equal to a thickness of the micro LED chip 130 in a direction perpendicular to the upper surface 320 of the RDL 220. Therefore, the transparent packaging layer 210 can cover the micro LED chip 130, and the transparent packaging layer 210 may further form a packaging plane 240 parallel to the RDL 220 through polishing. At least one pad 270 is further disposed on a lower surface 260 of the RDL 220. Each pad 270 is electrically connected to the at least one micro LED chip 130 by using the RDL 220. The at least one pad 270 may be soldered with a pad 340 on a drive backplane 300 of a display, so that the LED chip packaging module is mechanically and electrically connected to the drive backplane.

Figure 26:
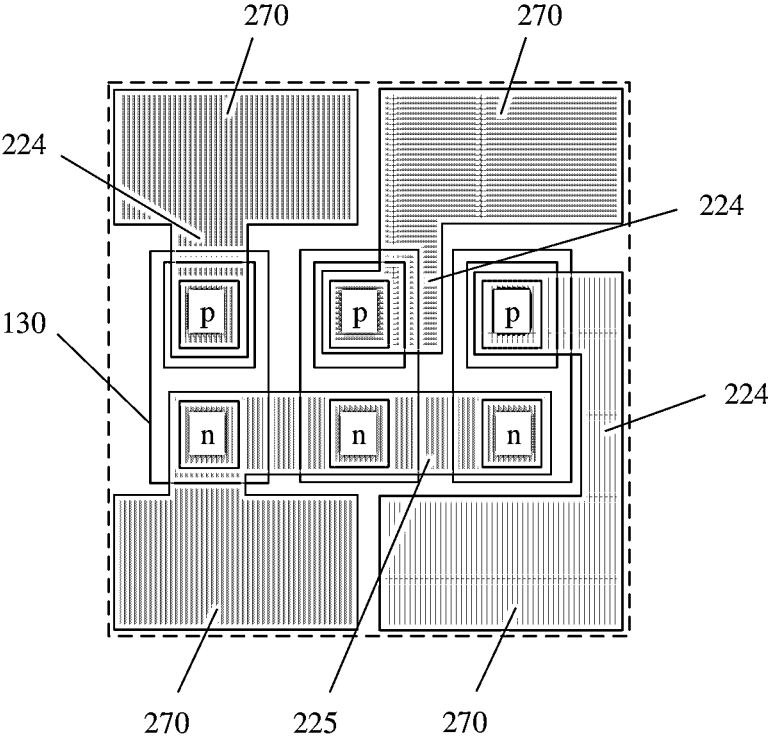
FIG. 26 is an example diagram of a pad and an RDL line of an LED chip packaging module.

FIG. 26 is an example diagram of a pad and an RDL line of an LED chip packaging module. As shown in FIG. 26, when one pixel includes three micro LED chips, and each micro LED chip includes a p-type ohmic electrode and an n-type ohmic electrode, a quantity of pads 270 corresponding to the micro LED chip may be 4. The p-type ohmic electrode of each micro LED chip may correspond to one pad 270. Each p-type ohmic electrode is connected to a pad 270 corresponding to the p-type ohmic electrode by using an RDL line 224. In addition, another pad 270 may be connected to three n-type ohmic electrodes of three micro LED chips by using an additional RDL line 225. Therefore, one pixel needs only four external pads 270. If the method shown in FIG. 1 is used, one pixel needs six external pads. It can be learned that the LED chip packaging module provided in this embodiment of this disclosure can reduce a quantity of external I/O pads. In addition, because the quantity of external I/O pads of the LED chip packaging module is reduced, when a size of the LED chip packaging module remains unchanged, a size of the pad 270 may be enlarged, and a size of a pad 340 that is on the drive backplane 300 and that is aligned with the pad 270 may be enlarged (as shown in FIG. 25), to reduce bonding difficulty between the LED chip packaging module and the drive backplane 300, and improve product yield.

When the micro LED chip packaging module provided in this embodiment of this disclosure is driven by an external drive signal, the drive signal is directly sent to at least one micro LED chip 130 by using a pad 270 and the RDL 220, so that one drive signal controls one or more micro LED chips 130. This can reduce a quantity of pads between the packaging module and an external device such as a drive backplane. Therefore, for the LED chip packaging module and the drive backplane that have the same size, a size of each pad may be larger, or even far greater than a size of the micro LED chip, to greatly reduce bonding difficulty between the LED chip packaging module and the drive backplane, and improve product yield.

In this embodiment of this disclosure, the micro LED chips 130 may form a standard RGB arrangement, a pentile arrangement, an RGB-Delta arrangement, an arrangement manner shown in FIG. 17 to FIG. 20, or another arrangement. Details are not described herein again.

It may be understood that, according to embodiments of the LED chip packaging module provided in this disclosure, two or three of the structures shown in FIG. 12, FIG. 23, and FIG. 25 may also appear in one LED chip packaging module at the same time. To avoid redundancy, this is not further described in this embodiment of this disclosure.

Figure 27:
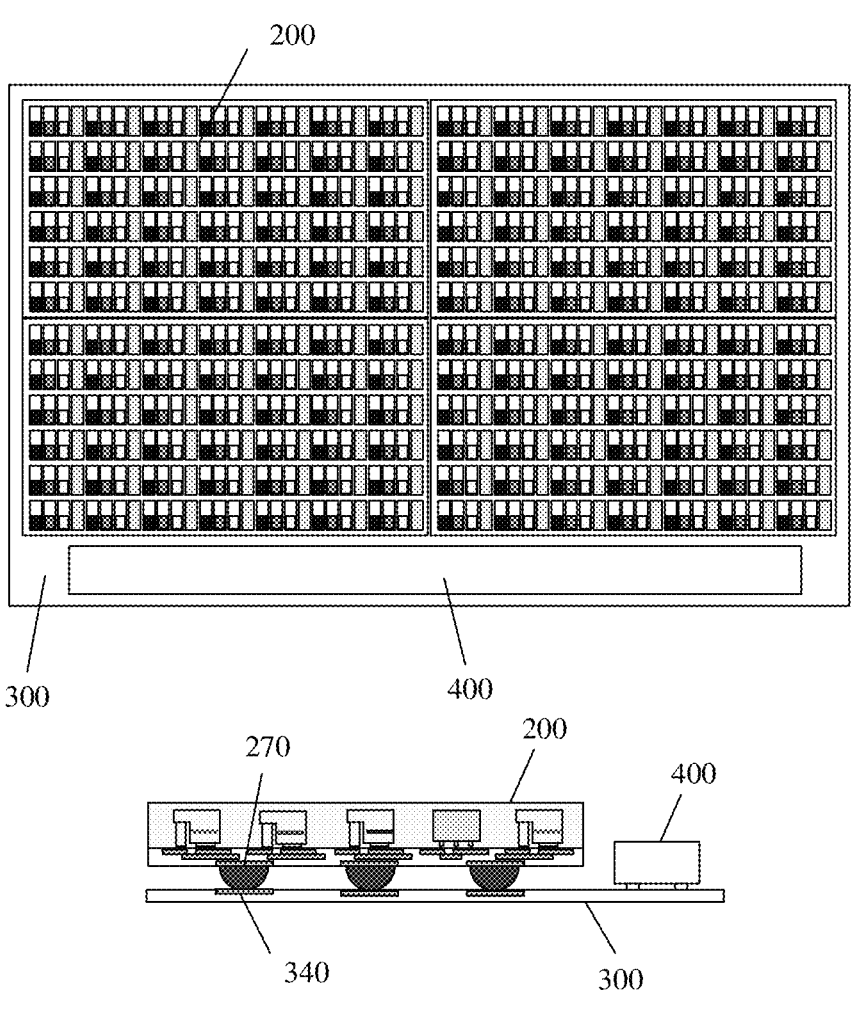
FIG. 27 is a schematic diagram of a structure of a display according to an embodiment of this disclosure.

An embodiment of this disclosure further provides a micro LED display. As shown in FIG. 27, the display may include a drive backplane 300, a DDIC 400, and at least one LED chip packaging module 200 provided in the foregoing embodiments of this disclosure.

The drive backplane 300 may be, for example, a glass backplane, a thin film base plate, a plastic backplane, or a TFT backplane. Correspondingly, the DDIC 400 may be packaged on the drive backplane 300 by using a packaging technology such as chip on plastic (COP) packaging technology, chip on film (COF) packaging technology, or chip on glass (COG) packaging technology.

A plurality of pads 340 are disposed on the drive backplane 300, and these pads 340 are in a one-to-one correspondence with positions of pads 270 of the LED chip packaging module 200. The LED chip packaging module 200 and the drive backplane 300 may be packaged together by using a packaging technology such as an SMT. Therefore, the pads 340 on the drive backplane 300 and the pads 270 of the LED chip packaging module 200 are soldered together in a one-to-one correspondence, to form electrical and mechanical connections. The pads 340 on the drive backplane 300 are further connected to the DDIC 400 by using a line, so that a drive signal of the DDIC 400 can be sent to the LED chip packaging module 200.

In an embodiment, the micro LED display may include only one LED chip packaging module 200. This type of display may be applied to, for example, an electronic device having a small-sized display, such as a smart band or a smartwatch. In this case, a quantity of the pads 340 of the drive backplane 300 may be the same as a quantity of pads 270 of one LED chip packaging module 200. Alternatively, a quantity of pads 340 may be not less than a quantity of pads 270 of one LED chip packaging module 200.

According to the technical solution of this embodiment of this disclosure, when the micro LED display includes one LED chip packaging module 200, and the LED chip packaging module 200 includes X (column)×Y (row) pixels, a quantity range of external pads 270 of the LED chip packaging module 200 may be between X+Y and X×Y×Z, where Z is a quantity of external I/Os of each pixel. Correspondingly, a quantity of pads 340 of the drive backplane 300 may also be between X+Y and X×Y×Z.

For example, when the DDIC 400 drives each pixel in the LED chip packaging module 200 by using a scan line and a data line architecture, a quantity of external pads 270 of the LED chip packaging module 200 may be only X+Y+M, where M is a few necessary pads such as pads corresponding to a clock signal (clock) and a ground signal (ground). Correspondingly, a quantity of pads 340 of the drive backplane may also be X+Y+M.

In an embodiment, the micro LED display may include only a plurality of LED chip packaging modules 200. The plurality of LED chip packaging modules 200 are spliced on the drive backplane 300 to form a completed display area. For example, this type of display may be applied to an electronic device having a small size and a large size, for example, a smart band, a smart watch, a mobile phone, a tablet computer, an e-reader, a television, a display, and a virtual/hybrid/augmented reality device. In this case, a quantity of the pads 340 of the drive backplane 300 may be the same as a total quantity of pads 270 of the plurality of LED chip packaging module 200. Alternatively, a quantity of pads 340 may be not less than a total quantity of pads 270 of the plurality of LED chip packaging module 200.

According to the technical solution of this embodiment of this disclosure, when the micro LED display includes K LED chip packaging modules 200, and each LED chip packaging module 200 includes X (column)×Y (row) pixels, a total quantity range of external pads 270 of the K LED chip packaging modules 200 may be between (X+Y)×K and X×Y×Z×K, where Z is a quantity of external I/Os of each pixel. Correspondingly, a quantity of pads 340 of the drive backplane 300 may also be between (X+Y)×K and X×Y×Z×K.

For example, when the DDIC 400 drives each pixel in the LED chip packaging module 200 by using a scan line (scan line) and a data line (data line) architecture, a quantity of external pads 270 of each LED chip packaging module 200 may be only X+Y+M, where M is a few necessary pads such as pads corresponding to a clock signal (clock) and a ground signal (ground). Correspondingly, a quantity of pads 340 of the drive backplane 300 may also be (X+Y+M)×K.

Figure 28:
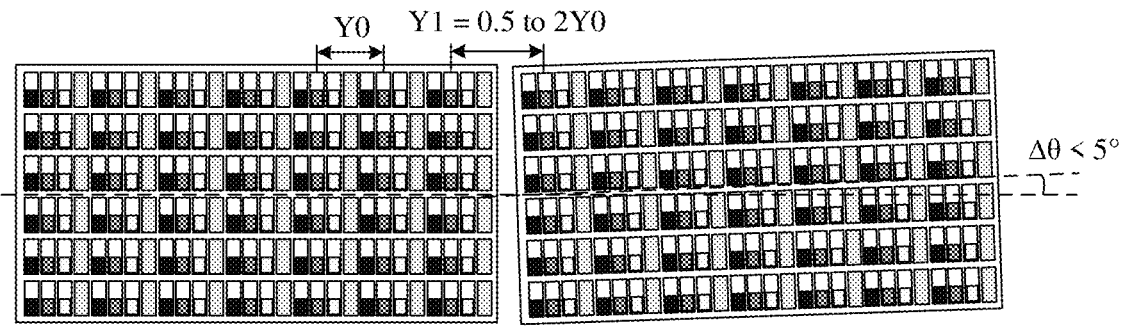
FIG. 28 is a schematic diagram of splicing an LED chip packaging module of a display according to an embodiment of this disclosure.

Further, as shown in FIG. 28, it should be additionally noted that, when two adjacent LED chip packaging modules 200 are spliced, to prevent a splicing gap or offset between the two LED chip packaging modules 200 from being perceived by a user, a spacing Y1 between two adjacent micro LED pixels between the two adjacent LED chip packaging modules 200 may be within a specific range, and is preferably between 0.5 and 2 times a pixel spacing Y0 in the LED chip packaging module 200. In addition, an angle deviation A0 between the two adjacent LED chip packaging modules 200 is less than a specific angle threshold. The threshold is preferably 5°, to achieve effect of seamless splicing of the two adjacent LED chip packaging modules 200 from a perspective of user perception.

For example, for a general display, a black matrix or another light isolation structure may be disposed between pixels. A width of the light isolation structure forms a part of a pixel spacing. However, when edges of the two LED chip packaging modules 200 to be spliced are pixels, the two LED chip packaging modules 200 may be first spliced, and then the light isolation structure is fabricated at a splicing position. Therefore, during splicing, due to factors such as alignment tolerance, a distance between an edgemost chip (a micro LED chip or a micro IC) of one LED chip packaging module 200 and an edgemost chip (a micro IC or a micro LED chip) of another LED chip packaging module 200 may be less than a width of the light isolation structure. In this case, the spacing between the two adjacent micro LED pixels at the module splicing position is less than the pixel spacing in the LED chip packaging module 200.

For example, for a display with a pixel density of 300 pixels per inch (ppi), a pixel spacing may be 80 μm. If a size of a micro LED chip is 10 μm, and a spacing between RGB chips is 5 μm, it may be deduced that a distance between a rightmost micro LED chip emitting red light of a pixel and a leftmost micro LED chip emitting blue light of an adjacent pixel is 30 μm. Therefore, as long as edges of the two LED chip packaging modules 200 to be spliced do not include the light isolation structure and a distance between the edges is less than 40 μm during splicing, the distance between two adjacent micro LED pixels at a module splicing position can be less than 80 μm, and a limit can reach 40 μm.

An embodiment of this disclosure further provides an electronic device. The electronic device includes any display or LED chip packaging module provided in the foregoing embodiments of this disclosure. In some embodiments, the electronic device may include a mobile phone, a tablet computer, a smart band, a smart watch, an e-reader, a television, a display, a virtual/hybrid/augmented reality device, a smart home device (for example, a smart speaker or a smart peephole) with a display, a home appliance device (for example, a refrigerator, an air purifier, a washing machine, or a water heater) with a display, and a traffic device (for example, an in-vehicle infotainment system, an autonomous driving platform, and a dashcam) with a display.

In addition, the electronic device provided in this embodiment of this disclosure may further include other components such as a processor, a memory, a battery, a speaker, an earpiece, and a camera. This is not specifically limited herein.

The technical solutions provided in embodiments of this disclosure have the following beneficial effect.

First, in the technical solutions provided in embodiments of this disclosure, a micro-nano bonding process is not necessary in a process of fabricating an LED chip packaging module. A micro bump does not need to be fabricated on an electrode of a micro LED chip. This avoids a problem that a device feature is affected because a solder material of the micro bump is diffused to an ohmic metal layer, improves a production yield, and avoids a problem that a packaging process of an LED chip with a high PPI is difficult due to a limitation of the micro-nano bonding process. In addition, because the micro-nano bonding process is not needed, a total thickness of pixels is reduced, and a depth-to-width ratio of the total thickness of pixels to a distance between the pixels is reduced. Therefore, an optical process between micro LED chips or pixels or a volumization process of another device becomes easier, which improves production yield.

In addition, in the technical solutions provided in embodiments of this disclosure, compared with a conventional micro-nano bonding process technology, a quantity of I/O pads on an LED chip packaging module and a drive backplane is significantly reduced. Therefore, for the LED chip packaging module and the drive backplane that have the same size, a size of each pad may be larger, or even far greater than a size of the micro LED chip, to greatly reduce bonding difficulty between the LED chip packaging module and the drive backplane, and improve product yield. For example, it is assumed that each pixel of the LED chip packaging module includes three micro LED chips, and a spacing between pixels is 0.1 mm. If a module includes 100×100 pixels, 10,000 pixels in total, a size of the entire module is 10 mm×10 mm. There are 30,000 micro LED chips in total. To fabricate this module, if a conventional micro-nano bonding process were used, each micro LED chip includes at least two electrodes: a positive electrode and a negative electrode. Therefore, at least 60,000 pads need to be placed in a 10 mm×10 mm area. When a fan-shaped package design is used, a maximum area and a maximum diameter of each pad are about 0.00167 mm² and 0.04 mm. A very small size causes very high process difficulty. However, if the method provided in embodiments of this disclosure is used, for example, three micro LED chips in each pixel are controlled by one micro IC to light up time or intensity. A DDIC of the drive backplane only needs to perform I/O communication with the micro IC, for example, notify, in a scanning manner, each micro IC that a color, brightness, and the like of the micro LED chip needs to be controlled. Therefore, the LED chip packaging module only needs to be provided with a pad configured to perform I/O communication with the DDIC. A signal transmitted from the DDIC to the micro IC is programmable and only needs to meet a specific display architecture. For example, if scan line and data line architectures are used to sequentially operate each group of pixels in the LED chip packaging module, the I/Os required by the LED chip packaging module for receiving external input signals or currents include only 100 I/Os corresponding to a scan line, 100 I/Os corresponding to a data line, and a few necessary clock signals (clock) and ground signals (ground). Therefore, a total quantity of external pads of the LED chip packaging module can be reduced to less than 300. In an extreme case, the quantity of external pads can reach 200. A maximum quantity of external pads is 100×100×Z, where Z indicates a quantity of external I/Os of each pixel. It can be learned that, in a 10 mm×10 mm area, a maximum area and a maximum diameter of each pad may reach 0.33 mm² and 0.577 mm, respectively. Therefore, a size of an external pad of the LED chip packaging module may be far greater than a size of the micro LED chip, thereby greatly reducing bonding difficulty between the LED chip packaging module and the drive backplane, and even implementing bonding by using a simpler SMT process.

In addition, the LED chip packaging module already includes micro ICs that can drive a small quantity of micro LED chips. The micro ICs of the micro LED chips form a drivable loop by using an RDL. Therefore, a probe may be used to input a drive signal from an I/O pad of the LED chip packaging module to directly perform display effect detection on the LED chip packaging module, to select LED chip packaging modules that have no defect or that have similar optoelectronic features, and combine the LED chip packaging modules into a display, thereby improving a yield rate and utilization.

In addition, the micro LED chip of the LED chip packaging module is fastened by using a transparent packaging layer, and a surface on which an electrode of each micro LED chip is located is located on a same plane. Therefore, heights and tilt angles of all micro LED chips can be consistent, thereby improving display uniformity.

What is claimed is:

1. An LED chip packaging module, comprising:
a re-distribution layer, RDL comprising a metal layer disposed on a chip, so that an electrode and/or an input/output pad (I/O pad) of the chip can be re-disposed at another position of the chip, to connect to another integrated circuit or chip, and/or connect to an electrode and/or I/O pad of a different chip;
a first pad disposed on a lower surface of the RDL;
a plurality of micro light emitting diode (LED) chips disposed on an upper surface of the RDL, wherein an electrode of each of the micro LED chips faces the RDL and is connected to the RDL, the micro LED chips forming a plurality of pixels, and each of the pixels comprises at least one micro LED chip;
a micro integrated circuit (IC) disposed on the upper surface and/or the lower surface of the RDL, wherein an electrode of the micro IC faces the RDL and is connected to the RDL; and
a transparent packaging layer disposed on the upper surface of the RDL, the transparent packaging layer covering a surface of each of the micro LED chips and/or the micro IC, the transparent packaging layer comprising, on a side away from the RDL, a packaging plane parallel to the upper surface of the RDL and a micro-nano structure is disposed on the packaging plane;
wherein the first pad is electrically connected to the micro IC by using the RDL, the micro IC is electrically connected to the micro LED chip by using the RDL, the first pad is configured to receive an external drive signal, and the micro IC is configured to control, based on the external drive signal, a working state of the micro LED chip electrically connected to the micro IC, wherein
the plurality of pixels correspond to one micro IC, the micro IC is disposed between the plurality of pixels corresponding to the micro IC, and the micro IC is electrically connected, by using the RDL, to the micro LED chips in the plurality of pixels corresponding to the micro IC.

2. The LED chip packaging module according to claim 1, wherein
each of the pixels corresponds to one micro IC, the micro IC is disposed adjacent to the pixel corresponding to the micro IC, and the micro IC is electrically connected, by using the RDL, to the micro LED chip in the pixel corresponding to the micro IC.

3. The LED chip packaging module according to claim 1, wherein
when the micro IC is located on the upper surface of the RDL, the electrode of the micro IC and the electrodes of the micro LED chips are located in a same plane.

4. The LED chip packaging module according to claim 1, further comprising:
a light isolation structure disposed on the upper surface of the RDL, wherein the light isolation structure is distributed between adjacent pixels, and/or the light isolation structure is distributed between adjacent micro LED chips.

5. The LED chip packaging module according to claim 1, further comprising:
a color conversion material, wherein surfaces of some or all of the micro LED chips are coated with the color conversion material, to convert chromatic light emitted by the micro LED chips into another color.

6. The LED chip packaging module according to claim 1, wherein
the pixel comprises N primary micro LED chips and N secondary micro LED chips that are in a one-to-one correspondence with the N primary micro LED chips, the secondary micro LED chip is configured to take over the job of the corresponding primary micro LED chip when the corresponding primary micro LED chip fails, and N is a positive integer.

7. The LED chip packaging module according to claim 1, wherein
the pixel comprises N primary micro LED chips and a secondary micro LED chip, the secondary micro LED chip is configured to take over, when any one of the primary micro LED chips fails, the job of the failed primary micro LED chip, and N is a positive integer.

8. The LED chip packaging module according to claim 1, wherein
the pixel comprises N primary micro LED chips, a secondary micro LED chip is further comprised between adjacent two pixels, the secondary micro LED chip is configured to take over, when any one of the primary micro LED chips in adjacent two pixels fails, the job of the failed primary micro LED chip, and N is a positive integer.

9. The LED chip packaging module according to claim 1, wherein when a light ray emitted by the micro LED chips to an external environment does not pass through the RDL, an insulation flat layer of the RDL is a non-transparent material.

10. The LED chip packaging module according to claim 1, wherein when a light ray emitted by the micro LED chips to an external environment passes through the RDL, an insulation flat layer of the RDL is a transparent material.

11. An LED chip packaging module, comprising:
a re-distribution layer RDL comprising a metal layer disposed on a chip, so that an electrode and/or an input/output pad (I/O pad) of the chip can be re-disposed at another position of the chip, to connect to another integrated circuit or chip, and/or connect to an electrode and/or I/O pad of a different chip, wherein a plurality of first pads are disposed on a lower surface of the RDL; and a plurality of micro light emitting diode chips disposed on an upper surface of the RDL, wherein an electrode of the micro LED chip faces the RDL and is connected to the RDL, the micro LED chips forming a plurality of pixels, and each of the pixels comprises at least one micro LED chip; and the first pad is electrically connected to the micro LED chip by using the RDL, the first pad is configured to receive an external drive signal, and the external drive signal is used to control a working state of the micro LED chip;

a transparent packaging layer disposed on the upper surface of the RDL, the transparent packaging layer covering a surface of each of the micro LED chips, the transparent packaging layer comprising, on a side away from the RDL, a packaging plane parallel to the upper surface of the RDL and a micro-nano structure is disposed on the packaging plane; and a light isolation structure disposed on the upper surface of the RDL, wherein the light isolation structure is distributed between adjacent pixels, and/or the light isolation structure is distributed between adjacent micro LED chips.

12. The chip packaging module according to claim 11, wherein each of the first pads is electrically connected to the micro LED chip of at least one of the pixels by using the RDL.

13. A display, comprising:

a drive backplane, a display driver integrated circuit (DDIC) configured to generate an external drive signal, and at least one LED chip packaging module, the at least one chip packaging module comprising: a re-distribution layer, RDL comprising a metal layer disposed on a chip, so that an electrode and/or an input/output pad (I/O pad) of the chip can be re-disposed at another position of the chip, to connect to another integrated circuit or chip, and/or connect to an electrode and/or I/O pad of a different chip, a first pad disposed on a lower surface of the RDL;

a plurality of micro light emitting diode (LED) chips disposed on an upper surface of the RDL, an electrode of each of the micro LED chips faces the RDL and is connected to the RDL; and a micro integrated circuit (IC) disposed on the upper surface and/or the lower surface of the RDL, wherein an electrode of the micro IC faces the RDL and is connected to the RDL, and the first pad is electrically connected to the micro IC by using the RDL, the micro IC is electrically connected to the micro LED chip by using the RDL, the first pad is configured to receive the external drive signal, and the micro IC is configured to control, based on the external drive signal, a working state of the micro LED chip electrically connected to the micro IC;

the DDIC and the at least one LED chip packaging module are disposed on the drive backplane;

the drive backplane comprises a second pad at a position corresponding to that of the first pad of the at least one LED chip packaging module, and the second pad is connected to the DDIC by using a line; and the first pad is configured for the LED chip packaging module to receive the external drive signal, and the first pad is soldered to the second pad using a bump.

* * * * *